US011643273B1

United States Patent
Ramezani

(10) Patent No.: US 11,643,273 B1
(45) Date of Patent: May 9, 2023

(54) ROLLER BRAKE

(71) Applicant: Milwaukee Electronics Corporation, Milwaukee, WI (US)

(72) Inventor: Kamran Ramezani, Sandford, FL (US)

(73) Assignee: Milwaukee Electronics Corporation, Milwaukee, WI (US)

( * ) Notice: Subject to any disclaimer, the term of this patent is extended or adjusted under 35 U.S.C. 154(b) by 0 days.

(21) Appl. No.: 17/534,654

(22) Filed: Nov. 24, 2021

Related U.S. Application Data

(60) Provisional application No. 63/117,789, filed on Nov. 24, 2020.

(51) Int. Cl.
  *B65G 13/075* (2006.01)
  *B65G 23/08* (2006.01)

(52) U.S. Cl.
  CPC .......... *B65G 13/075* (2013.01); *B65G 23/08* (2013.01)

(58) Field of Classification Search
  CPC .................. B65G 13/075; B65G 23/08
  See application file for complete search history.

(56) References Cited

U.S. PATENT DOCUMENTS

| 417,794 | A | * | 12/1889 | Tesla ...................... H02K 21/10 |
| 3,352,397 | A | | 11/1967 | Becker et al. |
| 3,789,960 | A | | 2/1974 | Warren |
| 4,000,796 | A | | 1/1977 | Bolton et al. |
| 4,000,808 | A | | 1/1977 | Pradon |
| 5,147,020 | A | | 9/1992 | Scherman et al. |
| 5,375,689 | A | | 12/1994 | Sapp |
| 6,467,601 | B2 | | 10/2002 | Schmale et al. |
| 6,527,097 | B2 | | 3/2003 | Dreyer |
| 7,021,456 | B2 | | 4/2006 | Haan et al. |
| 7,581,630 | B2 | | 9/2009 | Hong |
| 8,607,965 | B2 | | 12/2013 | Sejourne |
| 8,887,898 | B2 | | 11/2014 | Sejourne |
| 9,415,937 | B2 | * | 8/2016 | Küpper ............... B65G 13/075 |
| 9,862,544 | B2 | | 1/2018 | Reichel |
| 10,093,487 | B2 | | 10/2018 | Ramezani |
| 10,472,174 | B1 | * | 11/2019 | Robinson ............... B65G 47/52 |
| 10,618,737 | B2 | * | 4/2020 | Hofer .................... H02K 7/1025 |
| 2002/0013463 | A1 | | 1/2002 | Gupta et al. |
| 2007/0256908 | A1 | | 11/2007 | Yazaki et al. |

(Continued)

FOREIGN PATENT DOCUMENTS

| DE | 202017102415 U1 | * | 8/2017 | ............ B65G 13/06 |
| EP | 2922775 B1 | | 9/2016 | |
| EP | 3670398 A1 | | 6/2020 | |

(Continued)

*Primary Examiner* — Gene O Crawford
*Assistant Examiner* — Lester Rushin, III
(74) *Attorney, Agent, or Firm* — Boyle Fredrickson, S.C.

(57) ABSTRACT

A roller brake comprising: (a) a roller shaft that supports one or more ends of the roller brake; (b) a roller tube extending over all or a portion of the roller shaft; (c) a magnet; (d) a conductor located opposite the magnet and the conductor being in communication with the roller shaft when the magnet is in communication with the roller tube and the conductor being in communication with the roller tube when the magnet is in communication with the roller shaft; and (e) an air gap separating the magnet and the conductor; and wherein the conductor includes one or more recesses that are an absence of material in the conductor.

29 Claims, 11 Drawing Sheets

(56) References Cited

U.S. PATENT DOCUMENTS

2020/0095066 A1   3/2020   Niu et al.

FOREIGN PATENT DOCUMENTS

| | | | | | |
|---|---|---|---|---|---|
| ES | 2600753 | T3 | * | 2/2017 | ........... B65G 13/075 |
| JP | H08251949 | A | * | 9/1996 | |
| RU | 198420 | U1 | * | 7/2020 | |
| WO | 020127687 | A1 | | 6/2020 | |
| WO | 2020127483 | A1 | | 6/2020 | |

* cited by examiner

ROLLER BRAKE

CROSS-REFERENCE TO RELATED APPLICATIONS

This application claims the benefit of US provisional patent application Ser. No. 63/117,789 filed. Nov. 24, 2020, the entire disclosure and content of which is hereby incorporated by reference.

FIELD

The present teachings generally relate to a roller that includes a brake or is a brake to slow rotation of the roller as packages move along a conveyor and especially if the conveyor extends at a downward angle along the conveyor.

BACKGROUND

Conveyor systems are used through industry for many reasons such as loading or unloading a truck, moving articles within a machine or factory, or moving articles to a secondary packing location. Conveyor systems typically include a plurality of rollers so that as an article such as a box is placed on the conveyor system the article can be moved without lifting the article as the article moves between two locations. Some conveyor systems are motorized so that one or more of the rollers rotate to move an article along the conveyor system. These conveyor systems generally include a motor within one or more of the rollers or a motor that is suspended from the conveyor frame that rotates one or more of the rollers. The one or more rotated rollers may be coupled to other rollers so that multiple rollers are driven by a motor (e.g., creating a driven section). Some conveyor systems only include free rolling rollers that allow an article to move using gravity, a push from a user, or another article pushing a first article down the conveyor. As packages or items move along the conveyors via gravity the speed of the packages or items may increase in speed. Attempts have been made to create rollers that act as brakes.

Examples of conveyor systems that include brakes may be found in U.S. Pat. Nos. 5,375,689; 6,467,601; 8,607,965; 10,173,842; 10,472,174; and 10,793,372 all of which are incorporated by reference herein for all purposes. It would be attractive to have a roller that acts as a brake as items roll down a conveyor. It would be attractive to have a roller brake that is variable and an amount of torque may be varied depending upon a predetermined amount of torque desired. What is needed is a conductive material that includes open regions to vary an amount of resistance (e.g., torque) that the roller brake applies.

SUMMARY

The present teachings meet one or more of the present needs by providing: a roller brake comprising: (a) a roller shaft that supports one or more ends of the roller brake; (b) a roller tube extending over all or a portion of the roller shaft; (c) a magnet; (d) a conductor located opposite the magnet and the conductor being in communication with the roller shaft when the magnet is in communication with the roller tube and the conductor being in communication with the roller tube when the magnet is in communication with the roller shaft; and (e) an air gap separating the magnet and the conductor; and wherein the conductor includes one or more recesses that are an absence of material in the conductor.

The present teachings provide a roller that acts as a brake as items roll down a conveyor. The present teachings provide a roller brake that is variable and an amount of torque may be varied depending upon a predetermined amount of torque desired. The present teachings provide a conductive material that includes open regions to vary an amount of resistance (e.g., torque) that the roller brake applies.

DETAILED DESCRIPTION

Figure 1:
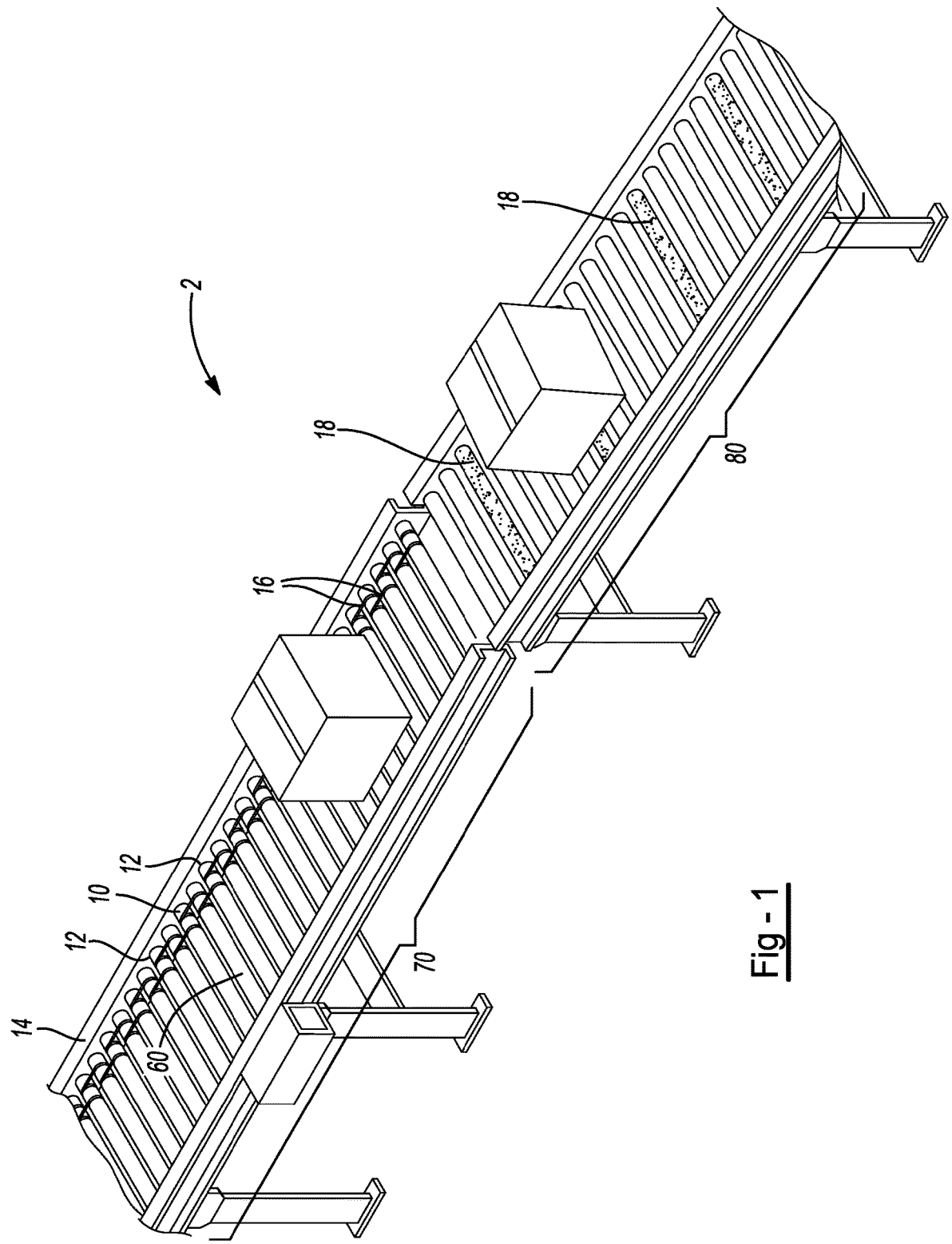
FIG. 1 is a perspective view of a conveyor system that included roller brakes.

The explanations and illustrations presented herein are intended to acquaint others skilled in the art with the teachings, its principles, and its practical application. Those skilled in the art may adapt and apply the teachings in its numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

The present teachings relate to one or more roller brakes that are connected to a machine that includes a frame or located between two or more frame members. The machine may be any machine that includes a roller that supports the packages or items. The machine may be a non-conveyor system. The machine may be any machine used to form or smooth a material, such a calendar for pressing paper. The machine may be a printing press. The machine may be any machine that has a drum used for slowing devices or creating resistance such as a belt in mining or in an exercise bike. Preferably, the machine may be part of a conveyor system.

The conveyor system functions to move articles or packages between two locations. The conveyor system may move items out of a truck, into a truck, within a factory or warehouse, from machine to machine, or a combination thereof. The conveyor system may have one or more interconnected rollers that are driven by a single motor. Preferably, the conveyor system may include a plurality of rollers that are connected together by one or more transfer devices. The conveyor system may move articles or packages via gravity (e.g., the conveyor extends at an angle so that objects move along the region without power). The conveyor system may be a roller conveyor, a belt conveyor, or a combination of both. The conveyor system may include one or more zones.

The one or more zones may operate independently of one another. Each of the zones may include one or more master rollers, one or more slave rollers, one or more roller brakes, or a combination thereof. Each zone may include a plurality of slave rollers, a plurality of roller brakes, or both. Each zone may be driven by one or more master rollers that provide power, torque, or both to a plurality of slave rollers via one or more transfer devices (e.g., a driven section). Some of the zones may be free of roller brakes, master rollers, or both. The zones may each be operated at different speeds. Some zones may be motorized or smart zones and other zones may be non-motorized or dumb zones. Some zones may be gravity fed (e.g., a gravity section). For example, a package may move along the zone without any external forces acting on the package. The zones may be a braking zone, a motorized zone, a gravity zone, a flat zone, a slowing zone, or a combination thereof. One or more of the zones may include master rollers or roller brakes. Preferably, the braking zones, the gravity zones, the slowing zones, or a combination thereof include roller brakes.

The roller brakes may function to reduce a speed of an object (e.g., package or pallet), normalize a speed of an object, stop an object, or a combination thereof. The roller brake may maintain spacing between objects. The roller brake may rotate in the direction of motion of an object but may slow speed of the object by rotating slower than the object is moving. The roller brake may be free of wires, power, electrical current, or a combination thereof. The roller brake may brake objects by friction as the object moves across the roller brake. The roller brake may have a roller tube (e.g., rotor) that rotates about a roller shaft.

The roller shaft functions to support the roller brake. The roller shaft may support the roller brake cantilever, at both ends, within a frame, in a conveyor frame, or a combination thereof. The roller shaft may be solid or hollow. The roller shaft may extend outward at ends and may be free of a center section. The roller shaft may be made of metal or include metal. The roller shaft may be made of or include a ferrous metal, a magnetic metal, iron, nickel, cobalt, or a combination thereof. The roller shaft may connect to a magnet, magnet cage, conductor, conductor cage, or a combination thereof so that the roller shaft only has end regions. The roller shaft may be free of movement. The roller shaft may support one or more magnets or a plurality of magnets. The roller shaft may support one or more conductors or a plurality of conductors.

The roller shaft may function to permit wires, conductors, movement members, or a combination thereof to have a portion inside of the motor brake and a portion outside of the motor brake. The roller shaft may be hollow. The roller shaft may have a solid outer circumference. The roller shaft may include one or more movement slots. The movement slots function to permit one or more wires, conductors, movement members, or a combination thereof to extend out of the shaft into contact with a magnet, conductor, or both. The movement slot may be an opening where material inside of the shaft may extend out of the roller shaft. The movement slot may allow the movement member, conductors, wires, or a combination thereof to move with a motor, a conductor, or both. The movement slot may be substantially located between the bearings, have a length equal to or less than a length of the roller shaft, or both. The movement shaft may determine a maximum length of movement of the movement member, the, magnet, conductor, or a combination thereof. The movement slot may permit a movement member located within the roller shaft to exit the roller shaft within the roller brake. The roller shaft may be separated from a roller tube. The roller shaft may extend partly through the roller tube. The roller shaft may have a portion that extends outside of the roller tube.

The roller tube functions to rotate so that objects move along the roller brake. The roller tube may delay motion of an object. The roller tube may slow motion of an object there along so that the object is slowed by the motor brake. The roller tube may be made of or include plastic, metal, a high friction material, a low friction material, or a combination thereof. Preferably the roller tube is made of metal or includes metal. The roller tube may be made of or include a ferrous metal, a magnetic metal, iron, nickel, cobalt, or a combination thereof. The roller shaft may connect to a magnet, magnet cage, conductor, conductor cage, or a combination thereof so that the roller shaft only has end regions. The roller tube may have a circular outside cross-section. The roller tube may house magnets, conductors, or both. The roller tube may support the magnets or the conductor. The roller tube may be an outermost surface of the roller brake. The roller tube may extend over all or a portion of the roller shaft, the magnets, the conductor, or both. The roller tube may be directly in contact with and connected to the one or more magnets or the one or more conductors. There may be some slippage between an object and a roller tube as the object moves relative to the roller brake. The object may be moving faster than the roller tube is rotating and the object may slip as the roller tube resists movement of the object relative to the roller tube. The roller tube may include a coating.

The coating functions to vary friction between an object and the roller tube. The coating may substantially prevent slippage between the roller tube and the object. The coating may be or include sand, grit, silica, crystals, glue, an adhesive, a tacky material, a rubber, or a combination thereof. The coating assists the object in transferring energy to the roller brake so that the roller brake begins to move. The coating may move a rotor relative to a stator. The coating may prevent slippage between the roller tube and the object while the roller tube acts to slow the object. The coating may act to hold the object in contact with the roller tube while the magnetic field from the magnet acts upon the conductor.

The magnet functions to create one or more magnetic fields that acts upon the conductor to create resistance and slow the roller tube, an object, or both. The magnet may be a multi-pole magnet. The magnet may include two or more, three or more, four or more, five or more, six or more, eight or more, or even ten or more poles. The magnet may include 20 or less, 16 or less, 14 or less, or 12 or less poles. The magnet may be in communication with the roller tube. The magnet may be in communication with the roller shaft. The magnet may be a stator or part of the stator. The magnet may be a rotor or part of the rotor. The magnet may be axially movable along a length of the roller brake. The magnet may be axially static. The magnet may be movable along the roller shaft, within the roller shaft, or both. The magnet may be movable relative to the conductor or vice versa. The magnet may be moved after the assembly is created. The magnet may be any of the magnets discussed herein. The magnet may be a permanent magnet. The magnet may be one solid magnet. The magnet may be a plurality of segmented magnets connected together. The magnets may be spaced apart from the conductor by an air gap.

The air gap functions to allow a magnetic field to extend from the magnets to the conductor. The air gap may allow the roller tube (e.g., rotor) to move relative to the roller shaft (e.g., stator). The air gap may be a space that permits a magnetic field to radiate outward. The air gap allows the magnetic field to act on the conductor. The air gap may separate the magnets and conductors. The air gap may be sufficiently large so that the conductor and magnet are free of contact. The air gap may be sufficiently small so that a magnetic field extends from the magnet and acts upon the conductor. The air gap may be about 0.5 mm or more, about 1 mm or more, about 2 mm or more, about 3 mm or more, about 5 cm or less, about 3 cm or less, or about 1 cm or less. The air gap may allow the magnetic field from the magnet to act on the conductor.

The conductor functions to interact with the magnetic field so that a torque is applied to a rotor. The conductor functions to create drag. The one or more conductors may be located opposite one or more magnets. The one or more conductors may be one unitary or monolithic conductor. The conductor may be made up of a plurality of pieces, a plurality of wires, or both. The pieces may be discrete. The pieces may be connected together or intertwined. The conductor may be a generally cylindrical wall. The conductor may have a hollow center. The conductor may be a sheet of material that is connected at its ends to form a circular shape. The conductor may be made of or include aluminum, copper, silver, nickel, bronze, brass, a coating (e.g., nickel coated silver), or a combination thereof. The conductor may have a thickness of about 0.00001 mm or more, about 0.0001 mm or more, about 0.001 mm or more, about 0.01 mm or more, about 0.1 mm or more, or about 1 mm or more. The conductor may have a thickness of about 10 mm or less, about 7 mm or less, about 5 mm or less, about 3 mm or less, about 2 mm or less, or about 1.25 mm or less. The conductor may be a plurality of wires that are wound together to create a conductor shape. The conductor shape may be a star shape. The conductor may be one or more, two or more, three or more, four or more, or five or more wires or pieces. The conductor may be ten or less, eight or less, or six or less wires or pieces. The shape, size, concentration, or a combination of the wires may vary along an axial length of the conductor. The conductor may be made of a plurality of wires that are discrete from one another. The conductor may include one or more ends. The ends of the conductor may extend into the roller shaft, through the roller shaft, or both. The ends of the conductor may be connected together. The ends of the conductor may be connected to one or more resistors. The resistors may function to vary resistance of the conductor, allow a user to very resistance of a final product, or both. The amount of resistance may be varied depending upon the number of ends connected together, a size of a resistor connected to the end, or a combination thereof. The amount of resistance created or connected to the ends may be about 1Ω or more, about 5Ω or more, about 10Ω or more, about 100Ω or more, about 250Ω or more, about 500Ω or more, or about 750Ω or more. The amount of resistance created or connected to the ends may be about 1000 KΩ or less, about 750 KΩ or less, about 500 KΩ or less, about 250 KΩ or less, about 100 KΩ or less, about 50 KΩ or less, about 10 KΩ or less, or about 1 KΩ or less. An amount of resistance of the conductor may vary along an axial length of the conductor based upon a number of factors discussed herein.

The conductor interacts with a magnetic field to create drag between a rotor and a stator. For example, if the conductor is on the rotor and the magnet is on the stator then as the conductor rotates about the magnet, the magnetic field acts on the conductor creates drag by pulling on the conductor. The conductor, the magnets, or both may be substantially a same length as a roller tube, magnets (or conductor respectively), roller shaft, or a combination thereof. The conductor, magnets, or both may be located on a first end, a second end, the middle, both ends, a full length, or a combination thereof of the motor brake. The conductor may be directly connected to a roller shaft or a roller tube. The conductor may be indirectly connected to the roller shaft via a support.

The support may be a thickened region of a roller shaft, a material added to the roller shaft to accommodate conductors or magnets. The support may be a piece of material that is located on an inside of the roller tube. The support may be material added to the roller shaft, the roller tube, or both to control air gap. The support may be made of or include metal, plastic, a ferrous material, iron, nickel, cobalt, a non-conductive material, a conductive material, or a combination thereof. The support may assist in mounting the magnet, the conductor, or both. The support may assist in connecting the conductor or the magnet within the roller brake. The support may be a magnetic material if the roller tube, the roller shaft, or both are not made of a magnetic material (e.g., aluminum). The support may assist in enhancing magnetic fields within the roller brake (e.g., ferromagnetic). The support may extend through or be connected between recesses in the conductor.

The conductor may have a cross-section that is circular. The conductor may be cylindrical. The conductor may be solid. The conductor may include one or more features such as holes, bars, recesses, slots, solid sections, or a combination thereof. The conductor may only include one feature. The conductor may include two or more, three or more, or four or more features. For example, the conductor may have a solid feature, through hole feature, slotted feature, or a combination thereof. The conductor may include indentations, recesses, or both.

The solid features may be a feature of the conductor that is free of recesses. The solid feature may be a feature with a highest torque or magnetic field of all of the features. The solid feature may be located next to another feature, between two features, or may be stand alone. The solid features may be located proximate to one or more recesses.

The recesses function to remove material from the conductor so that gaps are located in the conductor. The recesses may be a reduction in material of the conductor. The recesses may create spacing differences between the conductor and the magnet. The recesses may be an indentation in the conductor where the material is moved out of a plane of the conductor. The recesses may be an absence of material. The recesses may reduce an amount of conductive material within the conductor. The recesses may vary when the conductor is located within the magnetic field. The conductor may have a one or more recesses or a plurality of recesses. The conductor may have one or more recesses, two or more recesses, three or more recesses, five or more recesses, seven or more recesses, ten or more recesses, 15 or more recesses, or even 20 or more recesses. The conductor may have 100 or less, 75 or less, 50 or less, or 35 or less recesses. The number of recesses in the conductor may be a prime number. The number of recesses may be an odd number, an even number, a same number as the number of bars, or a combination thereof. The recesses may have a width and a length. The length of the recesses may be substantially equal to a length of the magnet. The recesses may be a same length as the magnet. The recesses may be shorter than the magnet. The recesses may terminate before an end of the conductor so that one or both ends of the conductor form a continuous piece, connect bars together, or both. The recesses may space apart bars or parts of the conductor. The recesses may extend through an end of a conductor so that discrete bars or conductor pieces are formed. The recesses may be spaces between discrete pieces of conductor. The recesses may be through holes, slots, or both.

The through holes function to be an absence of material. The through holes may be randomly oriented within the conductor. The through holes may be aligned in rows, columns, diagonally, patterns, geometric shapes, along a length, along a width, radially, or a combination thereof. The through holes may have virtually any shape. The through holes may have a shape that is geometric, non-geometric, circular, square, rectangular, oval, pentagonal, octagonal, or a combination thereof. The through holes may all be a same size. The through holes may all vary in size. The through holes may be one or more, two or more, or even three or more different sizes or shapes. The through holes may be employed with slots, bars, or both.

The slots function to be a long absence of material. The slots may separate bars. The slots may extend along a length of the conductor. The slots may have a length that is greater than its width. The length to width ratio may be about 2:1 or more, 3:1 or more, about 5:1 or more, or about 7:1 or more. The length to width ratio may be about 50:1 or less, about 30:1 or less, or about 10:1 or less. A width of the conductor may be larger than, smaller than, or substantially equal to a width of the bars. The width may be about 2 mm or more, 3 mm or more, 4 mm or more, 5 mm or more, 7 mm or more, 1 cm or more, 2 cm or more, or even 5 cm or more. The width may be about 18 cm or less, 15 cm or less, about 12 cm or less, about 10 cm or less, or about 7 cm or less. The conductor may include about 2 or more, 5 or more, 7 or more, 10 or more, 12 or more, or 15 or more slots. The conductor may include about 50 or less, about 30 or less, or about 15 or less slots. The slots may extend radially, longitudinally (vertically), at an angle relative to the length, at an angle relative to the width, in a circumferential direction, or a combination thereof. The slots may be an absence of material between bars of the conductor.

The bars function to interact with the magnetic fields of the magnets. The bars function to create all or a portion of a resistance. The bars function to assist in preventing rotation of the rotor. The bars may be connected to the rotor or the stator. The bars switch between interaction with a negative magnetic field and a positive magnetic field. The bars may be spaced apart to control an amount of torque applied. For example, if more torque is desired then more bars or wider bars may be provided. If less torque is desired then less bars or smaller width bars may be employed (e.g., a larger recess may be provided). The bars may be located between two recessed within a row or column. The bars may be located between two rows, two columns, or both. For example, a row of circular through holes may include bars between each circular through hole and each row of circular through holes may include bars between each row. The bars may extend circumferentially, longitudinally, radially, laterally, or a combination thereof. The bars may have linear sides or edges. The bars may have non-linear sides or edges. For example, if the bars are located between through holes the bars may have an edge with a shape of the through hole (e.g., semi-circular, semi-oval). The bars may have a sinusoidal shape, jagged shape, points, curves, or a combination thereof. A distance between bars may be uniform. A distance between some bars may be the same and other bars may be varied. The distance may have a pattern. For example, two bars may have a distance of 1 cm and 1 bar may have a distance of 2 cm that repeats. The width of the bars may be uniform. The width of the bars may vary. The width of the bars or orientation of the bars may be varied or tuned so that a desired amount of torque (e.g., drag) may be applied between the rotor and the stator. The width of the bars may be 2 mm or more, 3 mm or more, 5 mm or more, 7 mm or more, 1 cm or more, 2 cm or more, or 3 cm or more, The width of the bars may be 20 cm or less, 15 cm or less, 10 cm or less, 7 cm or less, or 5 cm or less. The conductor may include an even number of bars, an odd number of bars, a prime number of bars, or a combination thereof. The conductor may include 2 or more, 5 or more, 7 or more, 10 or more, 15 or more, 20 or more, or 25 or more bars. The conductor may include 50 or less, 40 or less, 30 or less, or 26 or less bars. The size, shape, and number of bars may be varied based upon the zone or location of the roller brake. The zones may communicate with one another via one or more controllers.

One or more controllers may be located within each zone, in connection with a motor, a motor brake, in connection with a master roller, or a combination thereof, and each of the one or more controllers may communicate with one another. The one or more controllers may be located within a master roller and in connection with the stator, the rotor, or both. The one or more controllers may be located along a conveyor system. The one or more controllers may operate each zone. The one or more controllers may control the motor or a motor brake of each zone. Each motor or a motor brake may have a standalone controller. The one or more controllers may communicate from one zone to another zone. The one or more controllers may operate a plurality of stators, rotors, or both. The plurality of controllers may be a master controller and one or more slave controllers. The master controller may provide instructions to a plurality of slave controllers. The master controller may be located proximate to one or more motors or motor brakes. The master controller may be located separate from the motor or motor brakes. The slave controllers may be located proximate to the motors or motor brakes. The master roller may be located at a central location and in communication with the slave controllers. The master controller and slave controllers may be in communication via a wire, wirelessly, or a combination of both. The plurality of controllers may be in communication via Wi-Fi, Bluetooth, near field communication, or a combination thereof. The controllers may be in communication with a detection device to control the motor or motor brakes. The detection device may be a laser, sensor, photocell, a motor position sensor, a roller position sensor, a roller speed sensor, or a combination thereof that detects a sustained presence of an object on the conveyor and stops the motor or motor brakes while the detection device detects the presence of an objection or detects objects passing thereby along the rollers of each zone. The controller may control the motor brakes by actuating a movement member.

The movement member functions to move one or more components of the motor brake to change torque or a magnetic field of a motor brake. The movement member may axially move a magnet, a conductor, or both. The movement member may be a cord, wire, string, a member that extends outside of the motor brake, or a combination thereof that permits movement of the magnet or conductor. A movement member may be attached to each end of the magnet, conductor, or both. A movement member may extend through the magnet, conductor, or both and be connected thereto to facilitate movement. The movement member may be used manually to facilitate movement or may be connected to a motor or actuator to facilitate movement. A controller may control braking, an amount of braking provided, or both. For example, if an average weight of items for a day is increased or decreased relative to a prior time period the new average weight may be inputted into the controller and the controller may adjust the motor brake to compensate for the change in average weight so that a desired speed may be maintained. A speed within each zone may be controlled by moving the movement member and attached magnet or conductor.

Each zone includes a plurality of rollers. Each of the plurality of rollers spans between two sides of a frame and support articles as the articles are moved along the rollers. Each zone may include one or more cantilever rollers. Preferably, when a cantilever roller is present the cantilever roller is a master roller. The plurality of rollers may all be in a single plane (e.g., coplanar). One or more of the rollers may be located out of plane (e.g., a master roller may be located below the slave rollers). The plurality of rollers include one or more master rollers and one or more slave rollers and the master rollers drive one or more of the slave rollers.

The one or more master rollers function to be rotated by a motor, move an article, move one or more slave rollers, or a combination thereof. The one or more master rollers may be a motor (e.g., an outside of the motor may serve to carry a load). Preferably, the master roller is a motor that rotates itself. The one or more master rollers may be an internal motor that includes substantially all of the motor components integrated with the master roller. Preferably, the one or more master rollers are a motor. Preferably, the master rollers are located in a same plane as the slave rollers, other master rollers, or both. The pulley may not directly support articles. The one or more master rollers and the one or more slave rollers may all be located in line. More preferably, the one or more master rollers (i.e., the motor) may directly contact an article moving across the conveyor system. For example, an article may move from the master roller to a slave roller, or may contact the master roller and one or more slave rollers at the same time. The one or more master rollers may be free of any intervening devices between the motor shaft and the roller shaft. The master roller may include a solid roller shaft that extends from a first end of the master roller to a second end of the master roller. The master roller may include a roller shaft that is entirely or partially hollow. The master roller may contact a first side of the frame and a second side of the frame to support the master roller within the conveyor system. The master roller may extend cantilevered from the frame. The motor shaft may be located at a first end and a second end and may be terminal so that the motor shaft does not extend through a body of the roller. The one or more master rollers may be located at an end of the conveyor system, in a middle of the conveyor system, or both. The one or more master rollers may be located between one or more slave rollers. The one or more master rollers may include a plurality of slave rollers on each side (e.g., upstream and downstream). The one or more master rollers may be substantially the same size as the slave rollers. The master rollers may be larger than the slave rollers. The one or more master rollers may be smaller than the one or more slave rollers. The one or more master rollers may be connected to one or more slave rollers via one or more transfer devices. The one or more master rollers may directly drive each slave roller via one or more transfer devices. The one or more master rollers may directly drive some slave rollers and indirectly drive some slave rollers via one or more transfer devices. For example, some slave rollers may drive other slave rollers by transfer devices extending between two or more slave rollers.

The one or more slave rollers may function to support one or more articles, one or more transfer devices, or both. The one or more slave rollers may assist in moving one or more articles. The one or more slave rollers may surround the master rollers. The one or more slave rollers may be substantially identical to the master rollers. The one or more slave rollers may extend parallel to the master rollers. Each slave roller is suspended between two pieces of the frame (e.g., a first frame piece and a second frame piece that are parallel to each other). Each zone may include at least one master roller and a plurality of slave rollers. The one or more slave rollers may be drive by a master roller or a transfer device from another slave roller. The one or more slave rollers may be freely rotatable. The one or more slave rollers may be free of communication with other salve rollers or master rollers. For example, as a package slides along the slave roller the slave roller may rotate so that the package continues to move (e.g., by gravity or a prior pushing force). The slave rollers may be connected to the frame at one or both ends. The one or more slave rollers, master rollers, or both may be connected to a frame.

The one or more frames function to support the plurality of rollers or the supports so that articles can move along the conveyor system. The frame may be one or more pieces that support one or more ends of the rollers, a motor, a controller, a roller brake, or a combination thereof. The one or more frames may be "L" shaped, "C" shaped, "U" shaped, "I shaped," or a combination thereof. Preferably, the one or more frames may be two parallel pieces. The one or more frames may connect two or more zones together or extend between two or more zones. The one or more frames may be connected to one or more bearings that support one or more ends of the rollers. The one or more frames may be directly connected to the one or more rollers and the roller shafts may be static relative to the frame and a roller housing may be movable relative to the roller shaft. The one or more motors may be directly connected to the frame. The motors may hang from the frame or extend between opposing portions of a frame. The controller housing may be connected to the frame and the motor housing may hang from the frame. The one or more frames may be made of metal and may support the rollers and articles that move along the frame. The frame may support the rollers so that the rollers rotate as the motor and transfer devices provide power between the plurality of rollers.

The transfer devices may function to provide power from a master roller to one or more slave rollers, from a slave roller to one or more adjacent slave rollers, or both. The one or more transfer devices may connect a motor, a master roller, or both to one or more slave rollers. Preferably, the transfer devices only connects rollers to rollers. For example, the transfer devices may connect a master roller to a slave roller or the transfer device may connect two or more slave rollers together. The transfer devices may extend around one or more support devices. The transfer device may connect a roller brake and one or more slave rollers. Preferably, the transfer device is free of contact or communication with a roller brake. The transfer devices may extend around both rollers and supports. For example, ends of a conveyor system may be rollers and between the rollers may be a plurality of supports. The transfer devices may be a belt. The transfer devices may be an "O" belt, "O" ring belt, "V" belt, "V" ring belt, or a combination thereof. The transfer devices may be one continuous piece. The transfer devices may be a plurality of pieces that are connected together. The transfer devices may include one or more grooves and preferably a plurality of grooves. The grooves may have a "V" shape. The grooves may have a complementary fit to grooves in the over roller cartridge. The transfer devices may include one or more spikes or teeth that extend from the transfer device. The transfer devices may be made of or include metal, rubber, fiber, a reinforcement, a natural material, a synthetic material, plastic, a polymer, poly vinyl chloride, urethane, neoprene, nylon, nitrile, polyester, leather, or a combination thereof. The transfer devices may be a chain, a reinforcement coated by rubber, a gear, a toothed member, a belt, or a combination thereof. The transfer device may be one or more flexible couplings.

The one or more transfer devices may be a conveyor belt. The one or more conveyor belts function to carry an article above a plurality of rollers. The one or more conveyor belts may be supported on the one or more rollers. The conveyor belts may be driven by one or more master rollers. The conveyor belt may be driven by friction between the conveyor belt and the master roller. The conveyor belts may receive the plurality or rollers so that the plurality of rollers are substantially covered by the conveyor belt. The conveyor belt may extend between two sides of the frame. The conveyor belt may be driven by one or more master rollers. The conveyor belt may be slowed by one or more roller brakes. The conveyor belt may be one solid piece that is connected together forming an endless conveyor belt. The conveyor belt may be made of rubber, poly vinyl chloride, urethane, neoprene, nylon, nitrile, polyester, leather or a combination thereof. The conveyor belt may extend over a body of the rollers and move independently of the roller shafts.

The one or more roller shafts function to connect the rollers to a frame, a motor, act as a stator, or a combination thereof. The one or more roller shafts may function to connect a roller shaped motor or a roller shaped brake within a frame. The one or more roller shafts may be fixedly connected to the frame. The one or more roller shafts may function to move relative to the frame. The roller shaft may be a motor shaft or a brake shaft. The roller shaft may function as both the roller shaft and the shaft that extends through the one or more stators or is a stator. The motor may be mounted to the one or more roller shafts in the shape of the master roller. The one or more roller shafts may be connected to one or more bearings. The one or more roller shafts may be connected to a frame by one or more bearings. Preferably, the motor shaft is directly connected to the frame and all or portion of the roller rotates around the roller shaft. The one or more roller shafts may be connected to the body of the roller by one or more bearings. The one or more roller shafts may move with the roller body (i.e., a fixed roller shaft). The one or more roller shafts may move independent of the body of the roller (i.e., a movable roller shaft). The one or more roller shafts may extend cantilever from a body of a roller. The one or more roller shafts may support the roller on the frame. The one or more roller shafts may be solid, hollow, have a smooth exterior, or a combination thereof. One or more wires may extend into the motor (or master roller) through the roller shaft. The one or more roller shafts may be hollow and air may flow through the roller shaft to cool the motor or the brake. The one or more roller shafts may have a cross-sectional shape that is circular, triangle, square, oval, pentagon, hexagon, octagon, heptagon, decagon, nonagon, or a combination thereof. The one or more roller shafts may function to allow the roller to rotate. The one or more roller shafts may function to carry a load, apply a load to a frame, or a combination thereof. The one or more roller shafts may extend into a bearing, a motor, or both. The one or more roller shafts may be fixed relative to the frame. The one or more roller shafts may have a smooth exterior. The one or more roller shafts may include one or more grooves and may be connected to one or more shaft covers.

The one or more shaft covers connect to a distal end, a proximal end, or both of a roller. The one or more shaft covers receive an end of a roller and connect the roller to a bearing, a controller housing, a frame, or a combination thereof. The roller cover may connect a rotor to a stator. The roller shaft may be pressed into a shaft cover. The one or more shaft covers may be connected to the shaft using an adhesive, fasteners, welding, interlocking (i.e., a male portion and a female portion), or a combination thereof. The one or more shaft covers may be shaped substantially similar to the roller shaft, or different. For example, the one or more shaft covers may receive a round roller shaft, thereafter connecting the roller shaft to one or more bearings using a hexagonal shaft of the one or more shaft covers. The shaft cover may extend over a roller shaft to connect the roller shaft to a bearing. The one or more shaft covers may be made from a similar material to that of the roller shaft, or different. The one or more shaft covers may function to assist in allowing the roller tube to rotate via a motor or transfer devices extending into grooves while the roller shaft remains static.

The one or more grooves may receive one or more transfer devices. The one or more grooves may be located in the roller tube, in the roller shaft, or both. The roller tube may include two or more grooves. The roller tube may include grooves, over roller cartridges, or both. The one or more grooves may receive one or more bushings. The one or more grooves may be sufficiently deep so that the one or more transfer devices, bushings, or both are flush with a body when the transfer devices are located within the grooves. The one or more grooves may assist the transfer devices in rotating the rollers. The one more grooves may be located in an end region of the motor shaft, the roller shaft, or both. The one or more grooves may transfer a force from the master roller (i.e., motor) to one or more slave rollers. The one or more motors may function to move one or more master rollers and transfer movement to a slaver roller by a groove.

The one or more motors may directly drive the one or more master rollers. The one or more motors may be sufficiently large to drive the master roller and one or more slave rollers, preferably four or more slave rollers, more preferably six or more slave rollers, even more preferably eight or more slave rollers, and most preferably ten or more slave rollers. The one or more motors may be formed so that the one or more motors are a master roller. The motor may run from alternating current source. The motor may run from direct current (DC) source. The motor may be a brushless motor. Preferably, the motor is a direct current brushless motor (e.g., brushless DC motor). The motor may include a motor shaft, shaft cover, bushing, motor cover, wires, controller, motor stator, magnets, motor rotor, motor hub, motor windings, or a combination thereof. The motor may be free of contact with a gear box. For example, the motor may be the master roller so that intervening gear boxes are not needed to rotate all or a portion of the master roller. The frame may dissipate heat generated by the motor. The motor may be in direct contact with the frame and the frame may be a heat sink for the motor (e.g., the motor shafts may be connected to the frame and the frame). One or more wires may extend through the roller shaft, the motor shaft, or both.

The one or more motor stators may function to move one or more rotors. The motor stator may be located within a master roller. The motor stator may include all or a portion that is housed within a magnet, roller tube, or both. The motor stator may be located opposite a one or more motor rotors. The motor rotor may include one or more magnets, one or more motor windings, or both. The motor stator may be powered to move the motor rotor by powering one or more windings of the motor stator. The one or more windings may be coiled or otherwise wrapped around the motor stator and receive power. The one or more windings may be copper, nickel, silver, silver coated copper, a conductive metal, or a combination thereof. The windings may be in the form of a continuous wire, coils, or separate wires interconnected. The motor stator may be free of contact with the magnets, the rotor, or both. The motor stator may assist in moving a motor rotor so that the motor rotates a master roller. Preferably, the motor stator is located within a center of the motor, in contact with a motor shaft, or both and the one or more magnets, roller tube, or both extend around the motor stator. The motor rotor, a plurality of magnets, or both, may extend around the motor stator. A rotor of the motor, a roller, a roller brake, a stator of a roller a rotor of a roller, or a combination thereof may include one or more magnets.

The one or more of magnets may function to rotate the rotor when the motor windings are powered or slow rotation of the rotor when the rotor is turned by an object. The one or more magnets may be a solid permanent ring magnet. The one or more ring magnets may be a single ring magnet. The one or more magnets may be a plurality of magnets. The ring magnet may be a segmented ring magnet. The segments may be connected together to form a ring magnet. The plurality of magnets may extend around an inside of the motor rotor or an outside of a stator. The plurality of magnets may form a ring magnet. The motor may include an even number of magnets. The magnets may have one or more poles, two or more poles, three or more poles, four or more poles, six or more poles, eight or more poles, or ten or more poles. The magnets may have 20 or less, 18 or less, 16 or less, 14 or less, or 12 or less poles. The magnets may have poles that extend circumferentially around the magnet. For example, the poles may alternate between North and South. The area of the North poles and South poles may be substantially a same size and circumferential length. A circumferential length of the North poles and the South poles may vary relative to one another or from pole to pole. The motor, the roller brake or both may include an odd number of magnets. The magnets may be modular. One or more magnets may be added or subtracted to vary an amount of torque or magnetic field created. For example, each magnet may have an axial length of 1 mm and 5 magnets may be added for a first torque and 6 magnets may be added for a second torque. The plurality of magnets may be 2 or more, 4 or more, 5 or more, 6 or more, 7, or more, 8 or more, 9 or more, or even 10 or more magnets. The plurality of ring magnets may be a plurality of pieces that are connected together axially. The plurality of ring magnets may be a plurality of pieces that are radially connected together to form a ring (e.g., arc shaped segments). The plurality of magnets may be about 25 or less, 20 or less, or 15 or less magnets.

The magnets may be made of or include a ferrous metal, neodymium, iron, boron, samarium, cobalt, rare earth metals. The one or more magnets may be formed using sintering, hot pressing, molding, or combination thereof. Preferably, the magnets may be formed by sintering or hot pressing so that the magnets are substantially pure. The one or more magnets may be formed using an adhesive. Preferably, the one or more magnets may be free of an adhesive. The one or more magnets may be coated using nickel, gold, chrome, copper, an epoxy resin, or a combination thereof. The one or more magnets may have a corrosion resistant coating. The one or more magnets may be coated with a sacrificial coating (e.g., zinc). The one or more magnets may be coated with a coating that does not affect the magnetism of the magnets. The coating may be an electroplated coating, a spray on coating, a hot dip coating, a rolled on coating, a baked on coating, or a combination thereof. The magnet may be substantially free of burrs. The one or more magnets may be connected to the rotor or stator of a roller (e.g., roller motor or roller brake). The one or more magnets may be axially connected, arc shape connected, or both by an adhesive or alignment tabs to form part of a motor rotor, the roller tube, roller brake, or a combination thereof. The one or more magnets may form a portion of the rotor. Preferably, the one or more magnets are connected via an adhesive and are free of alignment tabs (e.g., a male member that extends axially into a female member of another magnet so that the magnets are maintained in alignment). For example, axial ends of the magnets are substantially flat and each end is flat and planar. The ends of the magnets may be complementary to each other. The one or more magnets may be connected (e.g., arc shape connected) to form one or more ring magnets by an adhesive or connection mechanism. The connection mechanism may be a shaped portion of a mating end of a magnet. The one or more magnets when connected (e.g., arc shape connected) may have a plurality of semi-circular pieces (i.e., ring magnet segments) that when connected together form a complete circle. A magnet may include ring magnet segments that connect together to form a ring and the magnet may include 2 or more ring magnet segments (or pieces), 3 or more ring magnet segments, 4 or more ring magnet segments, 5 or more ring magnet segments, 6 or more ring magnet segments, 7 or more ring magnet segments, or 8 or more ring magnet segments. The magnet may include 20 or less ring magnet segments, 15 or less ring magnet segments, or 10 or less ring magnet segments. The ring magnet segments (e.g., arc shape pieces) may form about 10 degrees or more, about 30 degrees or more, about 45 degrees or more, about 60 degrees or more, or about 90 degrees or more of a circumference of a ring magnet. The arc shape pieces may form about 180 degrees or less or about 120 degrees or less of a circumference of a ring magnet.

The ring magnet may include an equal number of ring magnet segments and poles. The number of magnet sections may vary relative to the number of poles (e.g., magnetism). For example, the magnet may be made of two pieces of material and each piece of material may include four poles. The magnets may be made of any number of pieces discussed herein and each piece may include any of the poles discussed herein. The ring magnet may include more ring magnet segments than poles. The ring magnet may include one more ring magnet segment than pole. For example, the ring magnet may be made of 15 ring magnet segments and the ring magnet may be magnetized with 14 poles after the arc magnet segments are connected together. The ring magnet may include twice as many poles as ring magnet segments. For example, the ring magnet may include 16 ring magnet segments and 32 poles. The ring magnets may be magnetized so that one ring magnet segment includes one magnetization. For example, the ring magnet segment may be north or south. The ring magnet segment may include two or more types of magnetization. For example, each segment may include a part that is north and a part that is south. The ring magnet segments may include magnetization that are parallel to the longitudinal axis, the motor axis, or both. The ring magnet segments may include magnetization that is skewed relative to the longitudinal axis, the motor axis, or both. Each of the pieces may have a shape so that each of the pieces fit together. Each piece may have a mating end (e.g., axially or radially). For example, a first mating end of a first piece may form a complementary connection with a second mating end of a second piece, and the first mating end of the second piece may extend into a second mating end of third piece until a complete ring is formed. The mating ends may be flat. The mating ends may be contoured to connected together. One mating end may include a female feature. One mating end may include a male feature. The male features and the female features may connect together so that a ring is formed. The mating end (e.g., connection mechanism) may be v shaped, semi-circular shaped, U shaped, W shaped, M shaped, or a combination thereof. The one or more magnets may be joined together without an adhesive to form part of a motor rotor or roller brake. The arc shaped pieces may be touching each other at the mating ends. The arc shaped pieces may not touch each other at the mating area, but be connected to each other via spacers or molding material. Examples of magnets may be used are taught herein including the magnets taught in U.S. Pat. No. 10,093,487 and FIGS. 7A-12A; Column 13, line 33-Column 15, line 8 and Column 20, line 16 through Column 21, line 20 the teachings of which are expressly incorporated by reference herein for all purposes. The one or more magnets may have a keying mechanism or key recess and/or key to mate with a roller tube.

The roller tube may function to support and article, move an article, or both. The roller tube may encompass the motor, the brake, or both. The roller tube may be the outer surface of the roller (e.g., the master roller or roller brake). The roller tube may be a motor housing or a brake housing. The roller tube may be connected to the roller shaft by one or more bearings. The roller tube may connect to the one or more magnets or one or more conductors to form the motor rotor. The roller tube may extend axially along the length of the roller shaft and terminate substantially near the frame. Preferably, the roller tube is round (i.e., has a circular cross-section), and an interior surface of the roller tube mates with an exterior surface of the one or more magnets or conductors to form a motor rotor or motor brake surrounding the stator. The roller tube may have a smooth interior. The roller tube may include key recesses. The roller tube, stator shaft, roller shaft, or both may include one or more key recesses, keys, or both to mate with the one or more magnets, conductors, or both.

For example, the one roller tube or roller shaft may have a key recess that receives a key that is integrally formed with the magnet or conductor, over vice versa. If the roller tube or roller shaft includes a key recess then a separate key is inserted into the key recess of the roller tube or roller shaft and the magnet. The separate key may be inserted into the key recess of the roller tube or roller shaft before the magnets are installed into the roller tube. The roller tube or shaft and one or more magnets may both have a key recess to receive a separate key that is inserted to connect the roller tube or roller shaft and one or more magnets. The key may be a male part that is connected to or is an integral part of the roller shaft or roller tube. The key may be used without a key recess. The key may extend into a key recess in a conductor, a magnet, or both. The key may be a separate key that is formed of a substantially similar material as the roller tube or a different material.

The rotor may function to move one or more rollers, to rotate about a stator of the roller, or to have restricted movement relative to a stator so that objects in contact with the rotor are slowed or prevented from moving. The rotor may be connected to the motor shaft through bearings. The rotor may surround the stator, rotate about the stator, or both. A plurality of magnets may be spaced apart in and along the rotor. The plurality of magnets may be connected axially edge to edge (i.e., adhered together) in the rotor. The rotor may be rotated by the stator, the windings, an external object moving along the roller tube, or a combination thereof. The rotor may be rotated by the magnets when the motor windings are powered or an object slides along the roller tube. The motor may include a hub that is connected to the shaft through bearings. When the rotor is part of a roller motor, the one or more motor windings may be wound around the hub.

The one or more motor windings function to rotate the rotor when the motor windings are powered. The one or more motor windings may move the magnets when the motor windings are powered. The motor may include a plurality of motor windings. The motor windings may be complementary to the magnets. The motor windings may be surrounded by the one or more magnets, the roller tube, or both. The motor windings may be located within the motor housing to rotate the motor rotor resting on motor shaft by one or more bearings.

The motor housing is the roller tube. The motor housing may function as both a housing and a rotor. The motor housing serves as the back iron the magnetic poles mounted inside to transfer the magnetic field. The motor housing may be round. The motor housing may have an empty center (e.g., an internal pocket or a motor pocket) that receives the motor rotor, the motor stator, or both. The motor housing may include a single pocket and the one or more motor stators and the one or more controllers may be located within the single pocket. The motor housing (i.e., roller tube) may be connected to the motor shaft by bearings so that the motor housing rotates about the motor shaft (i.e., the roller tube rotates about the roller shaft).

The one or more bearings may function to support the rotor relative to the shaft as the rotor is rotated about the shaft. The one or more bearings may be end caps or part of end caps of the roller tube. The one or more bearings may be integrated into a bearing housing and the bearing housing may connect the bearings to a roller tube, a roller shaft, or both. The bearing housing may connect to the roller tube and the bearing may connect to the roller shaft. The bearing housing may form a friction fit with the bearing. The one or more bearings may permit the roller tube, rotor, or both to rotate relative to the motor shaft, motor stator, roller shaft, frame, or a combination thereof. The one or more bearings may be connected to the frame. The one or more bearings may be free of contact with the frame. The one or more bearings may allow the rollers to rotate about an axis. The one or more bearings may be located within a body (e.g., roller tube) of the roller. The one or more bearings may extend between the body of the roller and the roller shaft.

The one or more bearings may have a different geometry along an outer diameter and an inner diameter. For example, the one or more bearings may have a round outer diameter to mate with the roller tube, and have a hexagonal inner diameter to mate with the roller shaft. The one or more bearings may be a flange bearing. The bearing may be located within a housing that includes one or more flanges. The one or more flanges may function to connect the bearing to the frame. The one or more flanges may support the bearing on the frame but allow for some movement of the bearing relative to the frame, the flanges, or both. The one or more flanges of the flange bearing may receive one or more fasteners for connecting the bearing to the frame. The one or more bearings may be connected to the roller shaft, the motor shaft, the roller tube, or a combination thereof. The one or more bearings may be connected using a snap ring, a clamp band, a retaining ring, or a combination thereof. The one or more bearings may be prevented from moving axially by one or more snap rings, clamps, retaining rings, circlips, or a combination thereof. The one or more bearings may be flexible. The one or more bearings may be flexible so that the roller shaft may not be perpendicular to the frame on the drive side and/or the ride side. The one or more bearings may include a flexible sleeve that permits movement of the roller shaft.

The conductor, the roller brake, or both may be created by a method or process. A conductor may be produced by placing a conductor on a cutting surface. The conductor may be a planar piece of material. The conductor may be cut at one or more regions. The regions may be cut using a saw, punch, laser, torch, plasma cutter, drill, cnc machine, or a combination thereof. The regions may be all the same. The regions may be a single region. The regions may be two or more, three or more, or four or more regions. The regions may be cut to include through holes, slots, vertical slots, diagonal slots, recesses, bars, circles, ovals, or a combination thereof. One of the regions may be free of cutting. The conductor may be shaped. A first end of the conductor may be moved towards or proximate to a second end of the conductor. The first end and the second end may be connected together. The conductor may be formed into a circular shape. The conductor may be inserted into a roller tube, around a roller shaft, or both. The conductor may be connected to the roller tube, the roller shaft, a support, a magnetic material, or a combination thereof. A support may be inserted between a roller shaft and the conductor. The step of cutting may cut one or more different types of recess discussed herein.

FIG. 1 is a perspective view of a conveyor system 2 with a driven section 70 and a gravity section 80. The driven section 70 includes a master roller 10 and slave rollers 12 located within a frame 14. The master roller 10 drives the slave rollers by a plurality of transfer devices 16. The gravity section 80 includes roller brakes 18 that slow movement of objects along the gravity section.

Figure 2A:
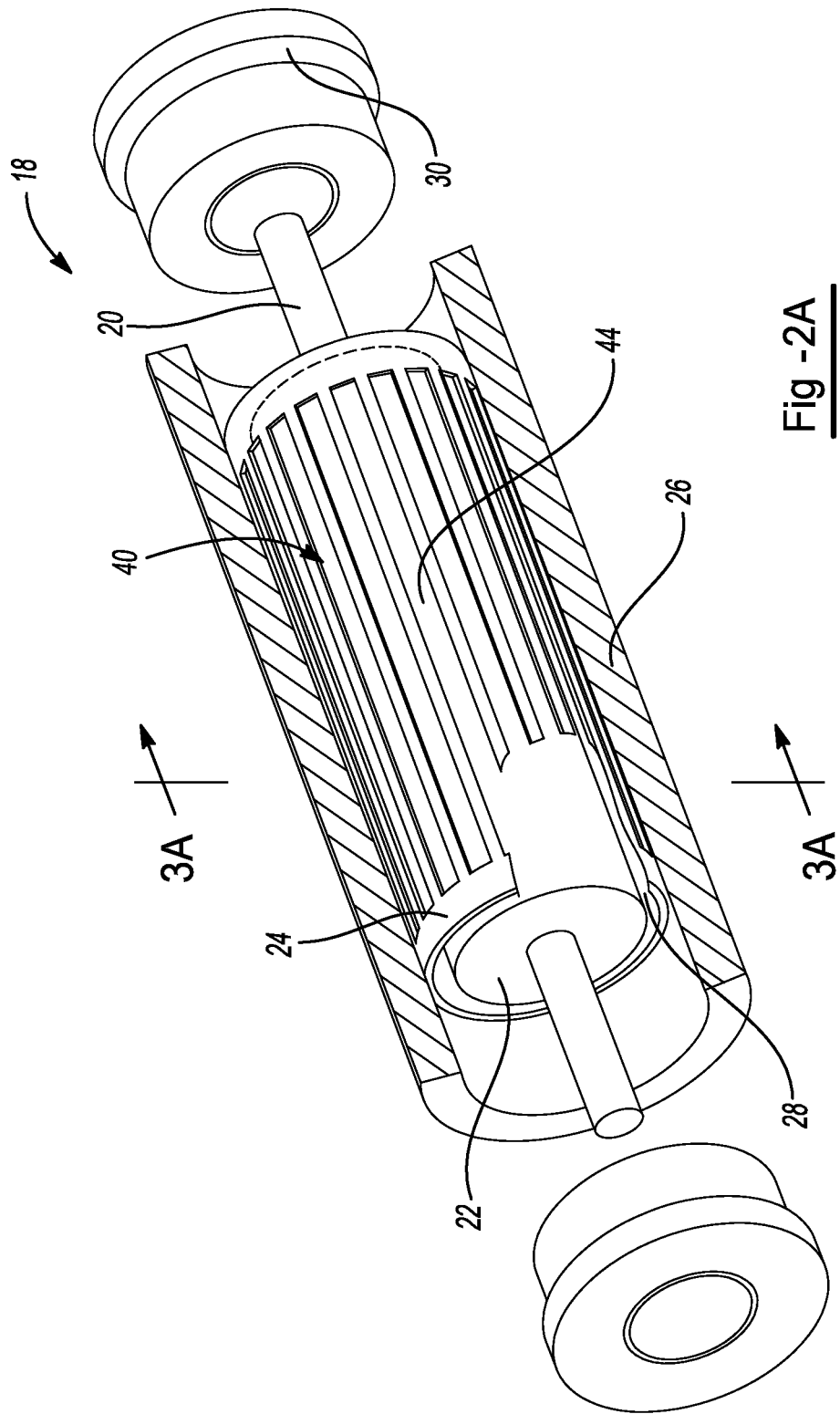
FIG. 2A is a perspective view of a partially cut away roller brake.

FIG. 2A is a roller brake 18 where the roller tube 26 is cut away and the conductor 24 is partially cut away. The roller brake 18 has a shaft 20 extending through magnets 22. A conductor 24 is connected to the roller tube 26 and is spaced apart from the magnets 22 by an air gap 28. The roller shaft 20 and the roller tube 26 are connected via bearings 30 so that the roller shaft 20 and roller tube 26 are movable relative to one another. The conductor 24 as shown includes recesses 40 that are shown as vertical slots 44.

Figure 2B:
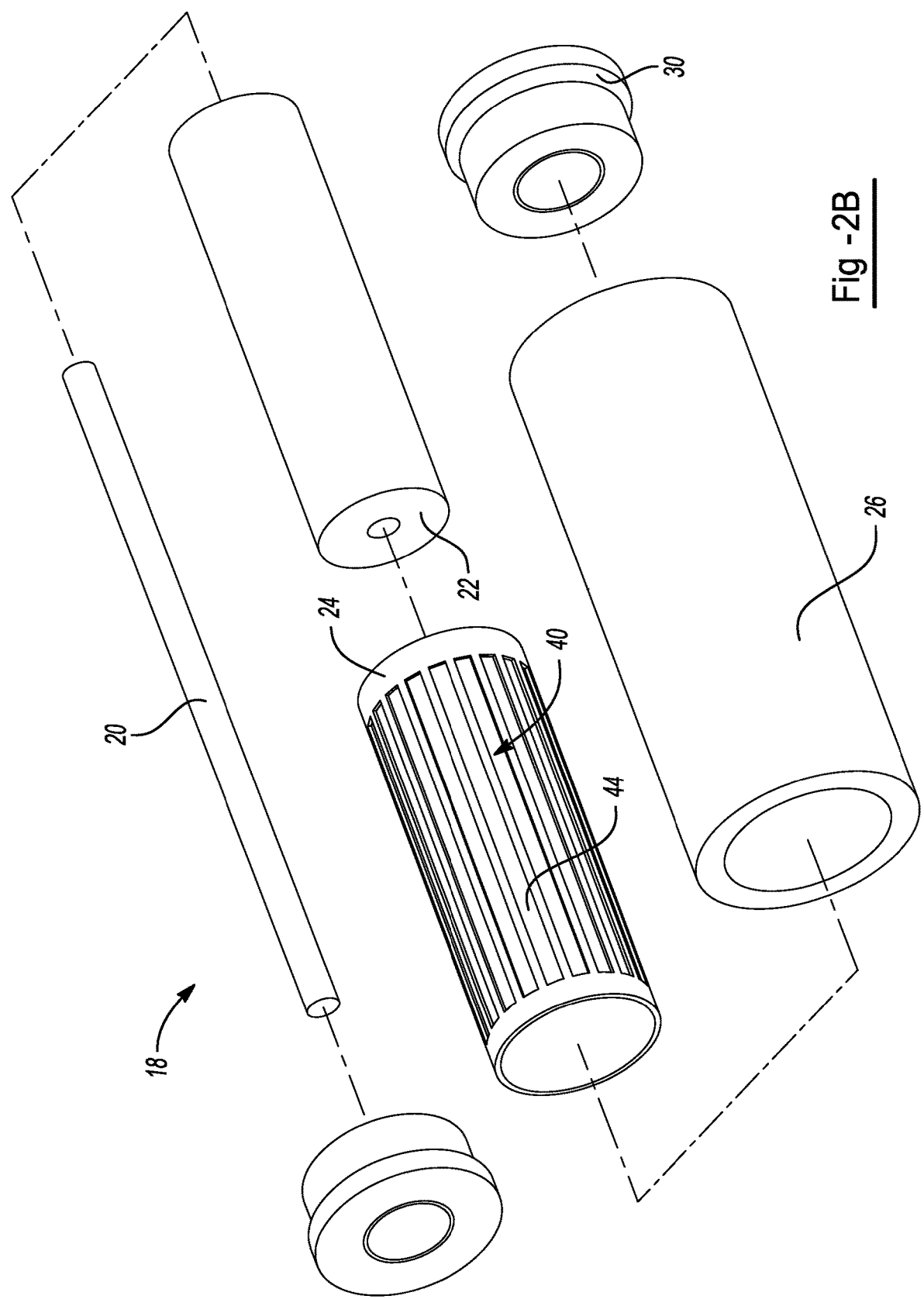
FIG. 2B is an exploded view of the roller brake of FIG. 2A.

FIG. 2B is an exploded view of the roller brake 18 of FIG. 2A. The roller brake 18 includes a roller shaft 20 that extends through a center of the magnet 22. The conductor 24 is located within and connected to the roller tube 26. The magnet 22 and the conductor 24 are spaced apart and contained within the roller tube 26 via opposing bearings 30. The conductor 24 includes recesses 40 that are shown as vertical slots 44.

Figure 3A:
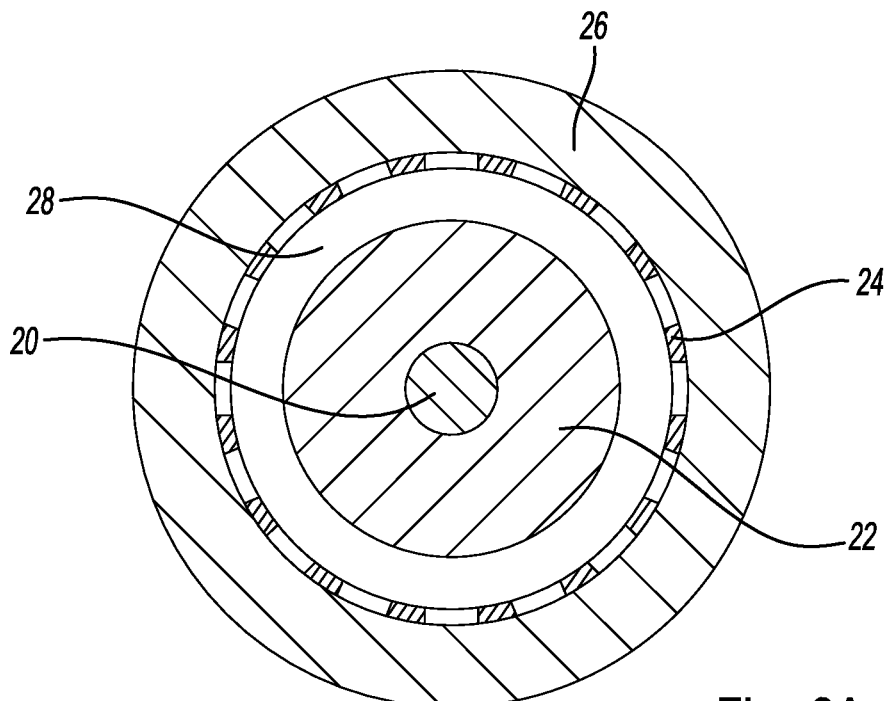
FIG. 3A is a cross-sectional view of the roller brake of FIG. 2 along lines 3A-3A.

FIG. 3A is a cross-sectional view of the roller brake of FIG. 2 along lines 3A-3A. A roller shaft 20 is surrounded by a magnet 22. The magnet 22 is spaced apart from a conductor 24 and roller tube 26 by an air gap 28.

Figure 3B:
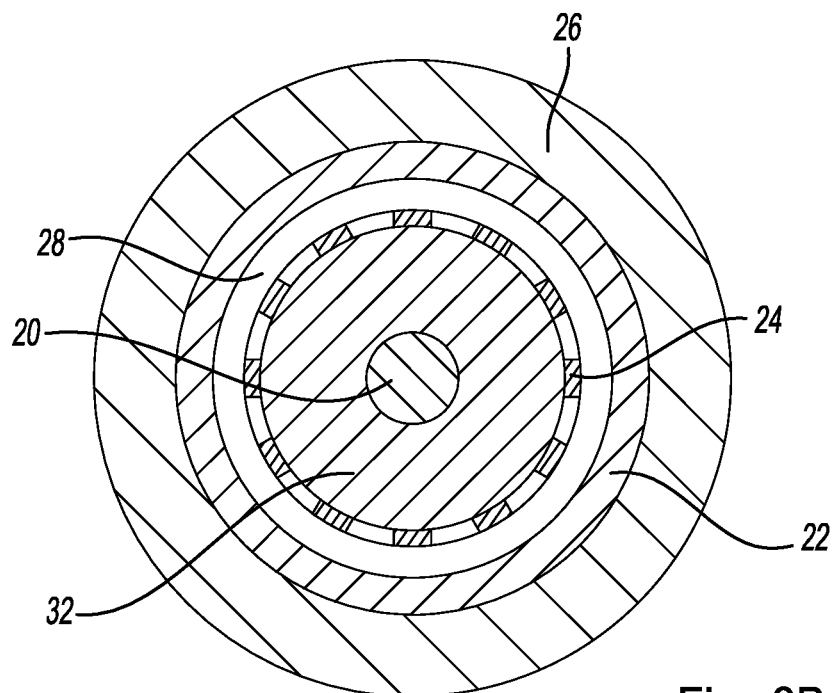
FIG. 3B is a cross-sectional view of a roller brake.

FIG. 3B illustrates a roller brake having a roller shaft 20 surrounded by a support 32 that attaches a conductor 24 to the shaft 20. An air gap 28 separates the conductor 24 and a magnet 22 that is connected to a roller tube 26.

Figure 3C:
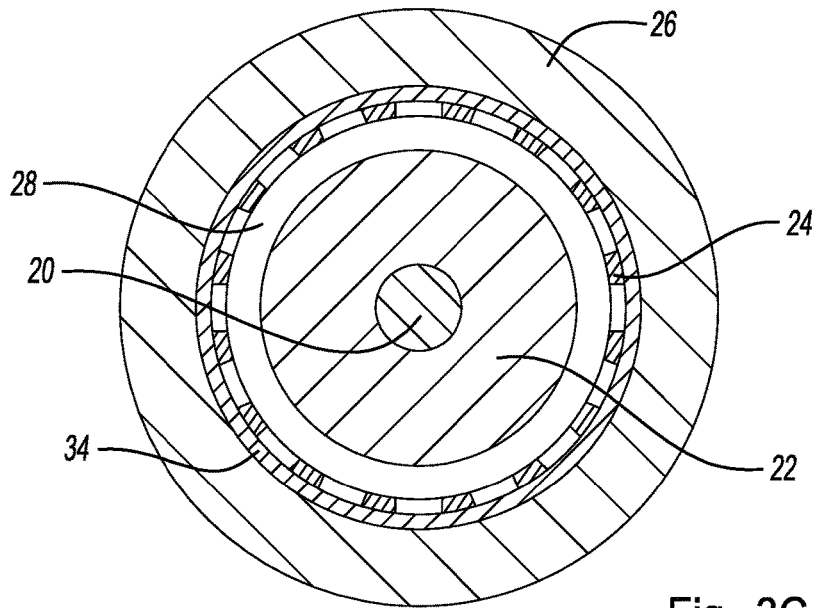
FIG. 3C is a cross-sectional view of a roller brake.

FIG. 3C illustrates a roller brake having a roller shaft 20 surrounded by and connected to a magnet 22. A roller tube 26 includes and is connected to a magnetic material 34 and a conductor 24. The conductor 24 is spaced apart from the magnet 22 by an air gap 28.

Figure 4A:
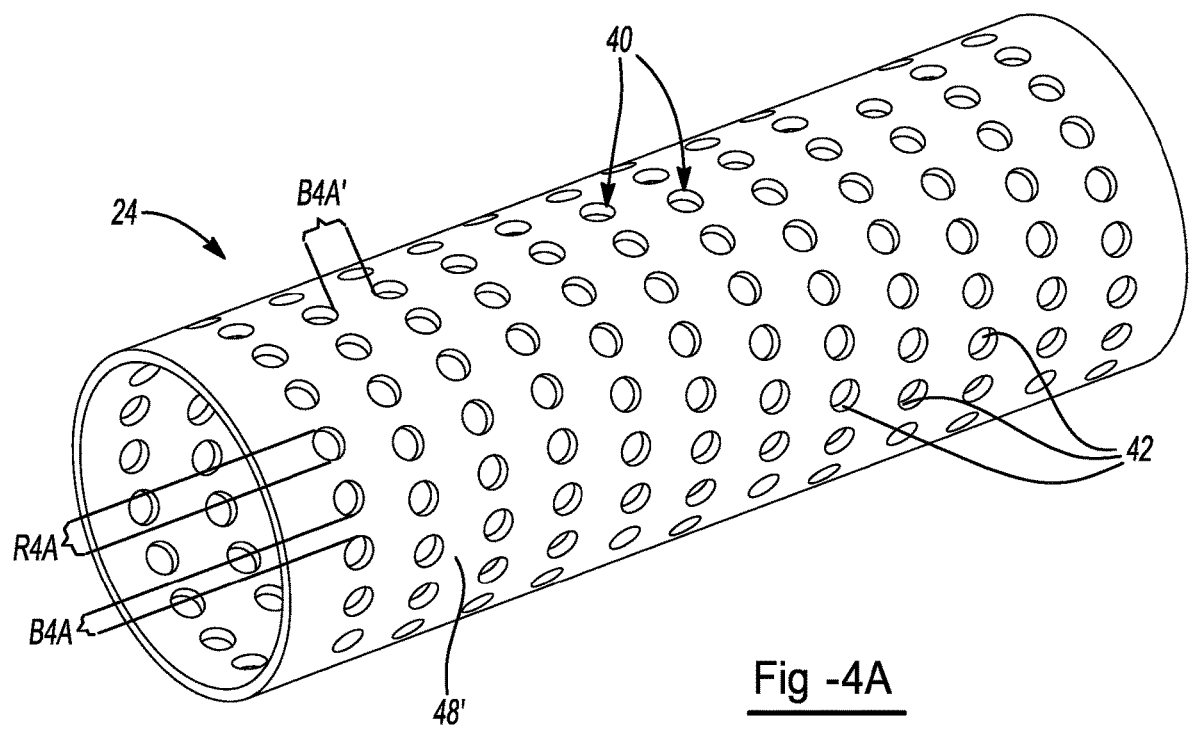
FIG. 4A illustrates a conductor with circular recesses.

FIG. 4A illustrates a conductor 24 with recesses 40 that are depicted as through holes 42. Each of the through holes 42 have a thickness (R4A) and are spaced apart from one another within a row by a bar 48 having a distance of (B4A). Each of the rows of through holes 42 are spaced apart by a distance (B4A').

Figure 4B:
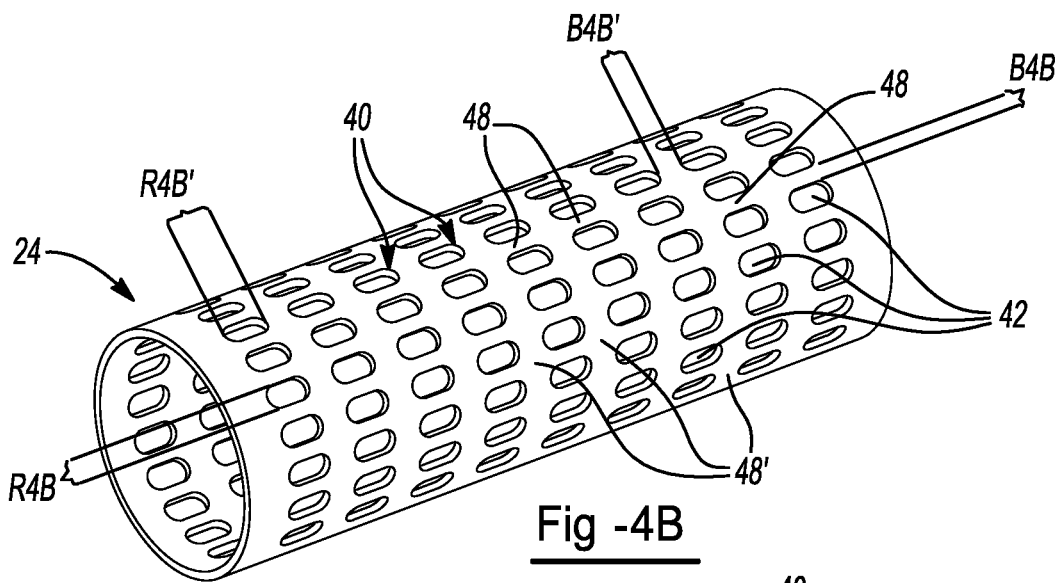
FIG. 4B illustrates a conductor with oval recesses.

FIG. 4B illustrates a conductor 24 with a plurality of recesses 40 that are elongated through holes 42. Each of the through holes 42 have a first thickness (R4B) and a second thickness (R4B'). Each of the through holes 42 are spaced apart by a bar 48 having a thickness (B4B) and each row of through holes 42 are spaced apart by bars 48' having a thickness (B4B').

Figure 5:
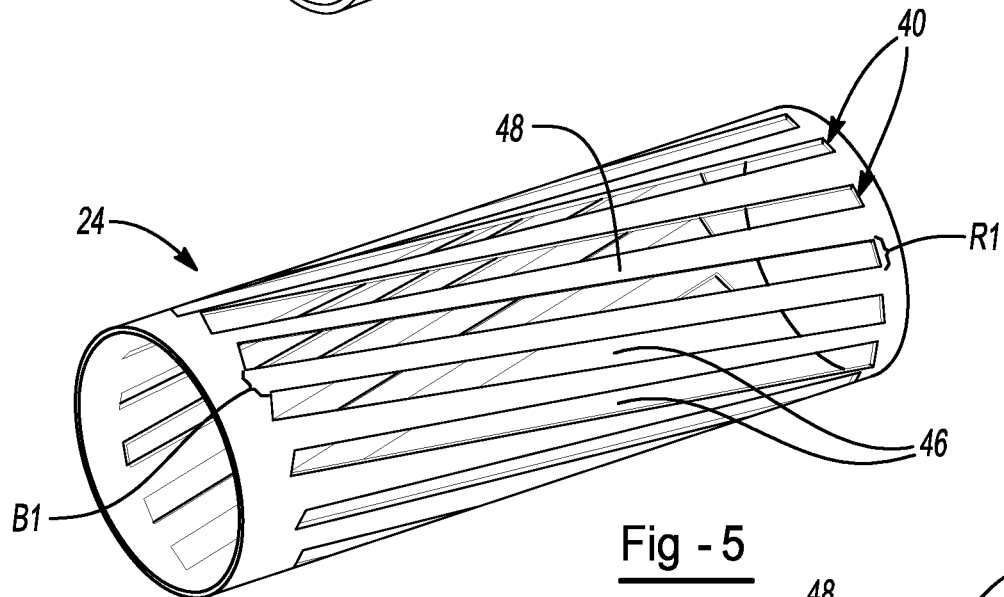
FIG. 5 illustrates a conductor with diagonal slots.

FIG. 5 illustrates a conductor 24 having recesses 40 that are diagonal slots 46 separated by bars 48. The diagonal slots 46 have a thickness (R1) and the bars 48 have a thickness (B1).

Figure 6:
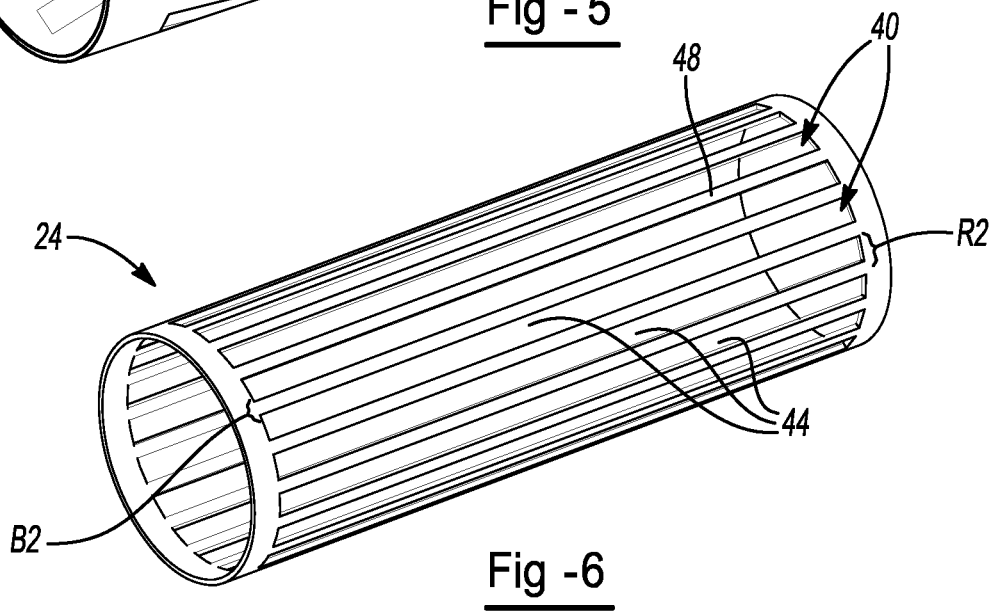
FIG. 6 illustrates a conductor with slots.

FIG. 6 illustrates a conductor 24 having recesses 40 that are vertical slots 44 separated by bars 48. The diagonal slots 46 have a thickness (R2) and the bars 48 have a thickness (B2).

Figure 7:
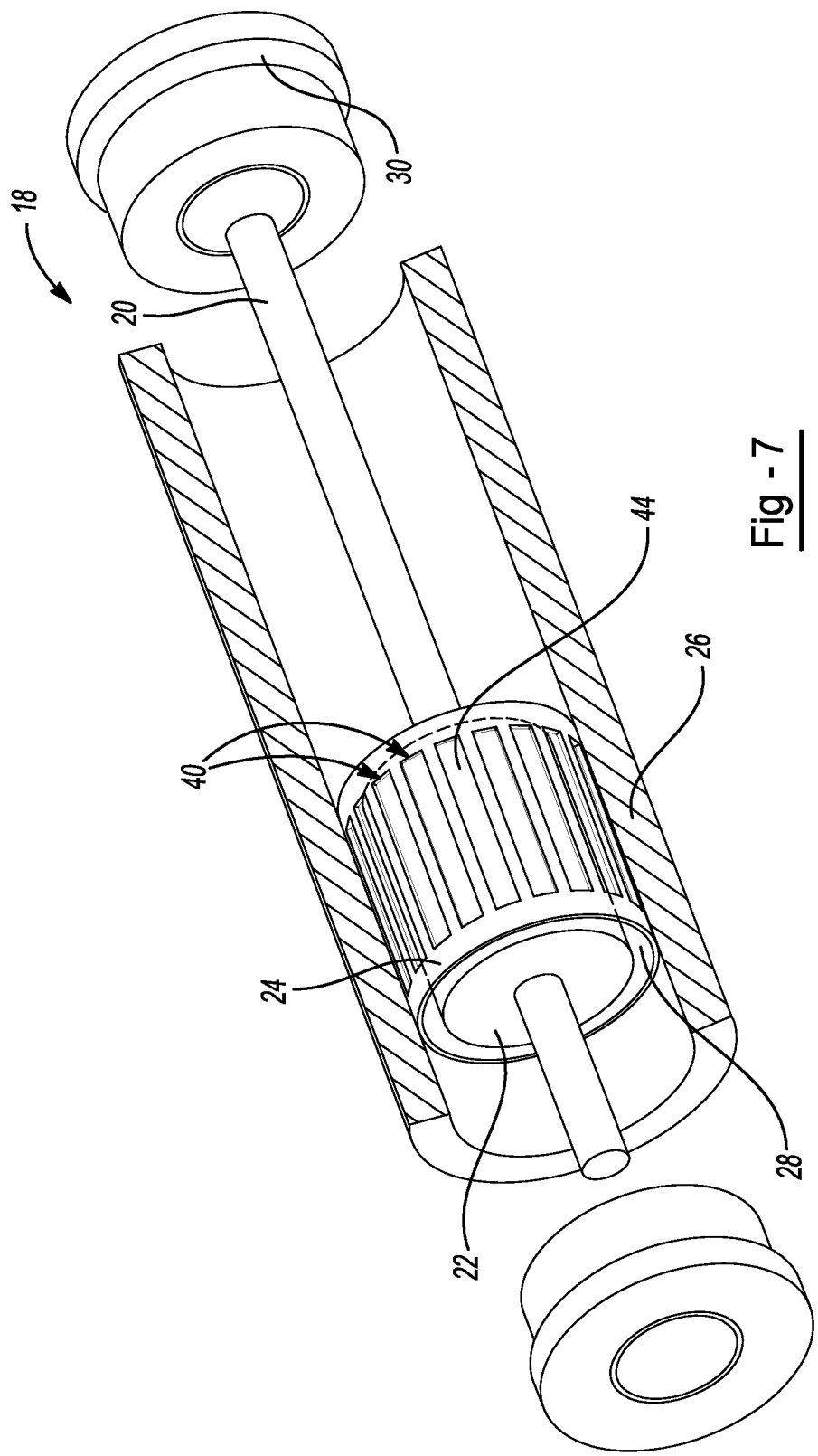
FIG. 7 is a side view of a roller brake with a brake that extends a portion of a length.

FIG. 7 is a perspective view of the motor brake 18 where the magnet 22 and conductor 24 are located on an end of the shaft 20. The bearings 30 connect the motor shaft 20 to the roller tube 26. The conductor 24 includes recesses 40 that are shown as vertical slots 44.

Figure 8:
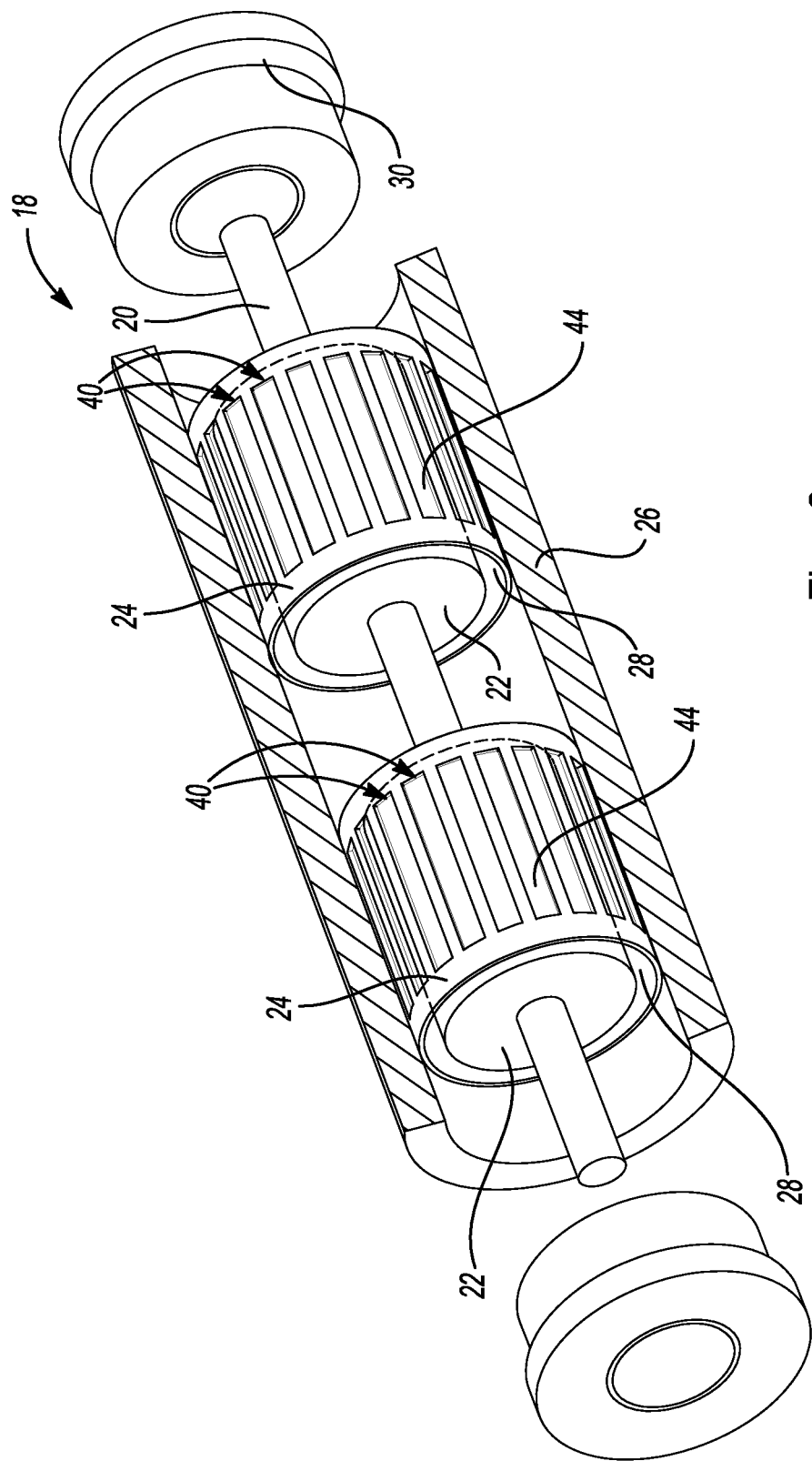
FIG. 8 is a side view of a roller brake with a brake located at opposing ends.

FIG. 8 is a perspective view of the motor brake 18 where the magnet 22 and conductor 24 are located on both ends of the shaft 20. The bearings 30 connect the motor shaft 20 to the roller tube 26. The conductor 24 includes recesses 40 that are shown as vertical slots 44.

Figure 9:
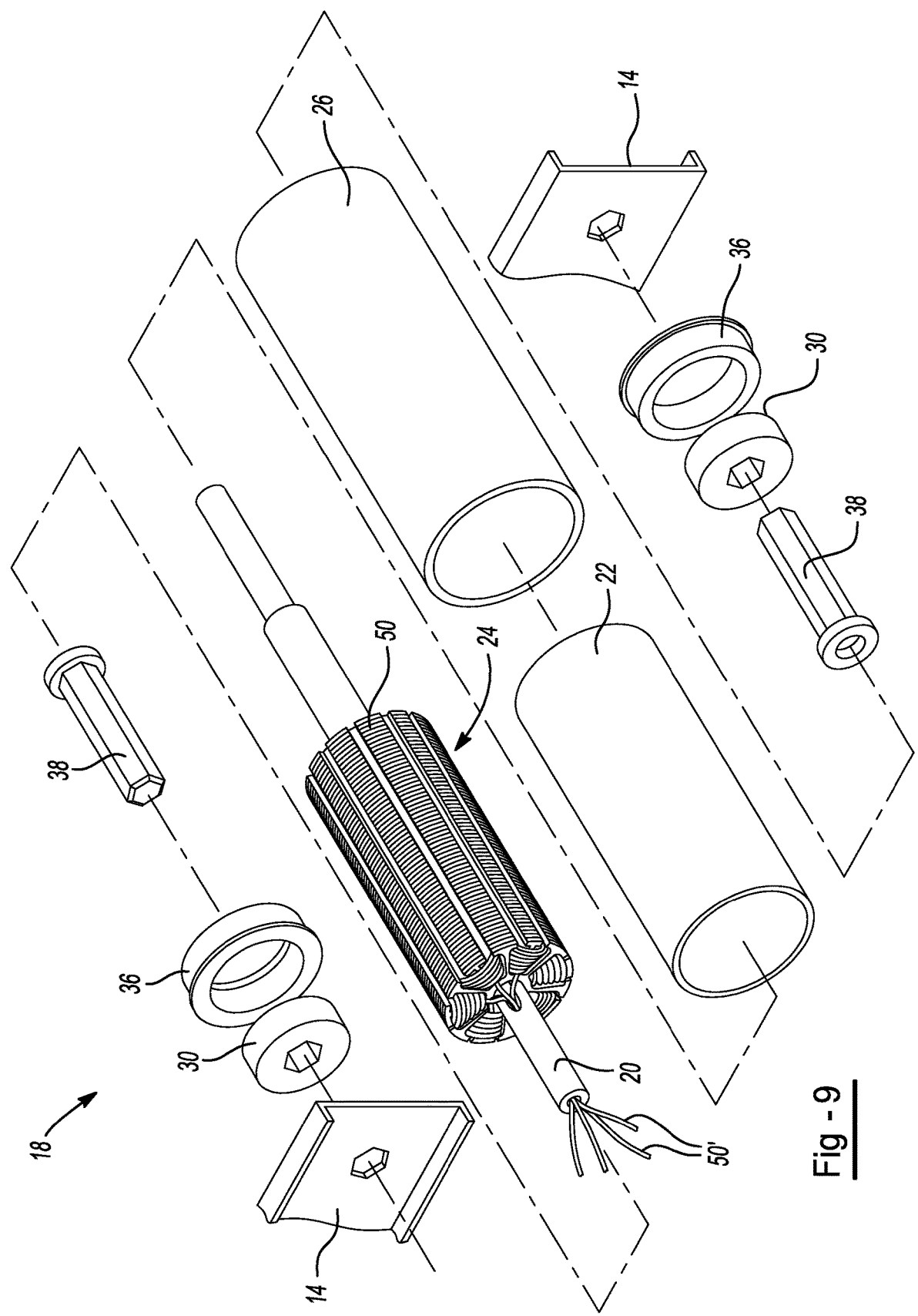
FIG. 9 is an exploded view of a roller brake with a conductor formed of a plurality of conductor windings.

FIG. 9 is an exploded view of a motor brake 18. The motor brake 18 extends between and is connected to two opposing frames 14 via a roller shaft 20. The roller shaft 20 has a shaft cover 38 that connects the roller shaft 20 to a bearing 30 and a frame 14. The bearing 30 is located within a bearing housing 36 that connects the bearing 30 to a roller tube 26. A conductor 24 is connected to the roller shaft 20 and the conductor 24 is made of a plurality of conductor wires 50 and some of the conductor wires 50 extend through the roller shaft 20 so that the conductor wires 50 are located outside of the motor brake 18. The conductor 24 is spaced apart from a magnet 22 and a roller tube 26.

Figure 10:
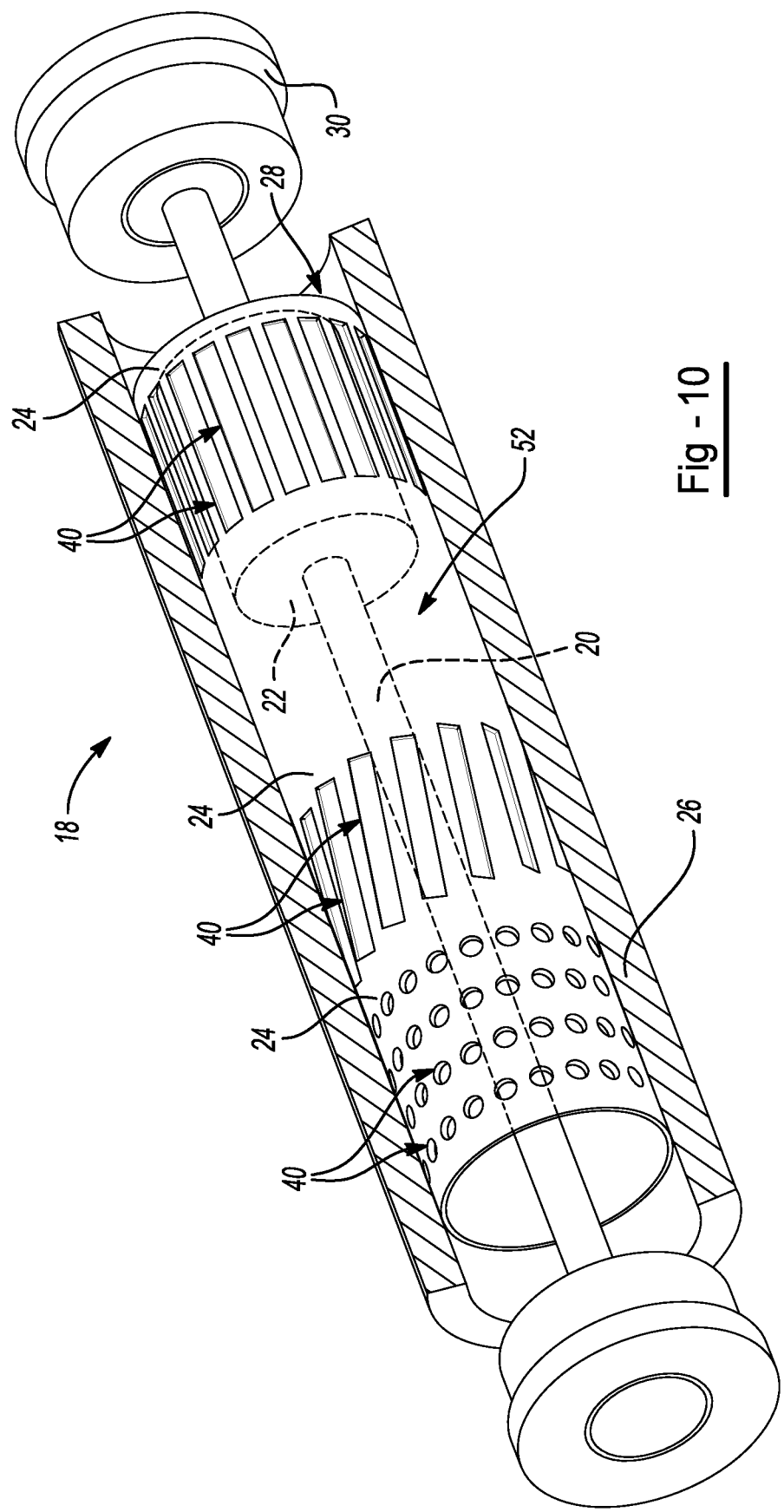
FIG. 10 is a perspective view of a variable conductor.

FIG. 10 is a perspective view of a partially cut away roller brake 18. The roller brake 18 includes a roller tube 26 (shown cut away) with bearings 30 at each end. A roller shaft 20 is connected to the bearings 30 and a magnet 22 is movably connected to the roller shaft 20. A conductor 24 is connected to the roller tube 26 and is spaced apart from the magnet 22 by an air gap 28. The conductor 24 includes four different sections. Three sections include recesses 40 shown as through holes, vertical slots, and diagonal slots. One section is free of recesses and is solid 52.

Figure 11:
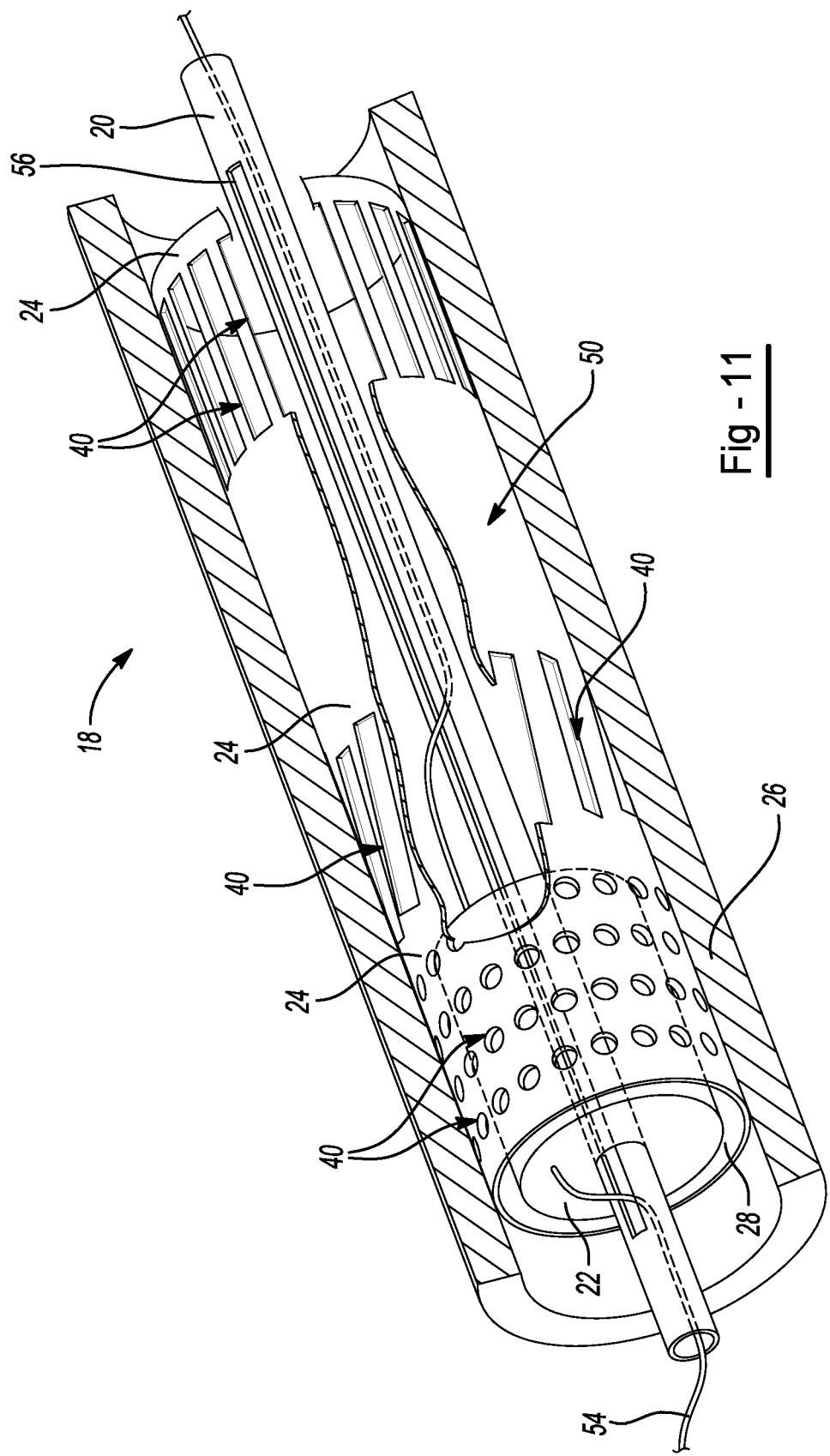
FIG. 11 is a perspective view of a variable conductor and a movable magnet.

FIG. 11 is a perspective view of a partially cut away roller brake 18. The roller brake 18 includes a roller tube 26 (shown cut away) and conductor 24 (partially cut away). A roller shaft 20 extends through the roller brake 18 and a magnet 22 is movably connected to the roller shaft 20. The roller shaft 20 includes a movement slot 56 that creates an open area for a movement member 54 to extend through and connect to each side of the magnet 22 so that the movement member 54 can move the magnet along the roller shaft 22. A conductor 24 is connected to the roller tube 26 and is spaced apart from the magnet 22 by an air gap 28. The conductor 24 includes four different sections. Three sections include recesses 40 shown as through holes, vertical slots, and diagonal slots. One section is free of recesses and is solid 52. An amount of torque or resistance created is varied by moving the magnet 22 between the four sections by pulling on the movement 54 on the first side or the movement member 54 on the second side of the magnet 22.

Variation 1 may comprise: a roller brake comprising: (a) a roller shaft that supports one or more ends of the roller brake; (b) a roller tube extending over all or a portion of the roller shaft; (c) a magnet; (d) a conductor located opposite the magnet and the conductor being in communication with the roller shaft when the magnet is in communication with the roller tube and the conductor being in communication with the roller tube when the magnet is in communication with the roller shaft; and (e) an air gap separating the magnet and the conductor; and wherein the conductor includes one or more recesses that are an absence of material in the conductor.

Variation 2 may include the roller brake of variation 1, wherein the one or more recesses are a plurality of recesses.

Variation 3 may include the roller brake of variation 1 or variation 2, wherein the plurality of recesses have a circular shape, a square shape, a rectangular shape, are linear, are parallel to one another, are symmetrical, asymmetrical, geometric, or a combination thereof.

Variation 4 may include the roller brake of any of variations 1 through 3, wherein the one or more recesses are vertical slots, diagonal slots, or both.

Variation 5 may include the roller brake of any of variations 1 through 4, wherein the conductor has a cylindrical shape and a wall of the cylinder includes the recesses.

Variation 6 may include the roller brake of any of variations 1 through 5, wherein the conductor is made of or include aluminum, copper, silver, bronze, brass, silver coated nickel, or a combination thereof.

Variation 7 may include the roller brake of any of variations 1 through 6, wherein the conductor has substantially a same length as the roller shaft, the roller tube, or both.

Variation 8 may include the roller brake of any of variations 1 through 6, wherein the conductor is located in a first end region, a second end region, or both end regions.

Variation 9 may include the roller brake of any of variations 1 through 7, wherein the magnet has substantially a same length as a roller shaft, a roller tube, the conductor, or a combination thereof.

Variation 10 may include the roller brake of any of variations 1 through 6 or 8, wherein the magnet is located in a first end region, a second end region, or both end regions.

Variation 11 may include the roller brake of any of variations 1 through 10, wherein the conductor has a thickness of between about 0.00001 mm and 10 mm.

Variation 12 may include the roller brake of any of variations 1 through 10, wherein the conductor has a thickness of about 0.00001 mm or more, about 0.0001 mm or more, about 0.001 mm or more, about 0.01 mm or more, about 0.1 mm or more, or about 1 mm or more.

Variation 13 may include the roller brake of variation 12 or any of variations 1 through 10, wherein the conductor has a thickens of about 10 mm or less, about 7 mm or less, about 5 mm or less, about 3 mm or less, about 2 mm or less, or about 1.25 mm or less.

Variation 14 may include the conveyor system comprising one or more roller brakes of any of variations 1 through 13.

Variation 15 may include the conveyor system of variation 14, wherein the conveyor system includes a region that extends at an angle so that items or packages in communication with the region move along the region by gravity and the roller brake controls speed of the items or packages.

Variation 16 may include the conveyor system of any of the preceding variations, wherein the conductor is connected to a magnetic material.

Variation 17 may include the conveyor system of variation 16, wherein the magnetic material is a ferromagnetic material.

Variation 18 may include the conveyor of any of the preceding variations, wherein the magnet is part of a rotor and the conductor is part of a stator.

Variation 19 may include the conveyor of any of variations 1 through 17, wherein the conductor is part of a rotor and the magnet is part of a stator.

Variation 20 may include the conveyor of any of the preceding variations, wherein the conductor is a plurality of wires.

Variation 21 may include the conveyor of variation 20, wherein the plurality of wires are discrete from one another and electrically separate.

Variation 22 may include the conveyor of variation 20, wherein the plurality of wires are electrically connected to one or more other wires of the plurality of wires.

Variation 23 may include the conveyor of variation 20, wherein one of the plurality of wires are electrically connected to one or more resistors.

Variation 24 may include the conveyor of any of variations 20-23, wherein the plurality of wires are in a star pattern.

Variation 25 may comprise a method comprising: (a) placing a planar conductor on a cutting surface; (b) cutting one or more regions of the planar conductor; (c) shaping the planar conductor so that a first end and a second end of the planar conductor are proximate to one another; (d) connecting the first end and the second end together to form a conductor; and (d) inserting the conductor into an assembly of a motor brake.

Variation 26 may include the method of variation 25, wherein the conductor is in contact with and connected to a roller tube.

Variation 27 may include the method of variation 25, wherein the conductor is in contact with and connected to a roller shaft.

Variation 28 may include the method of any of variations 25 through 27, wherein a support is located between a roller shaft and the conductor.

Variation 29 may include the method of any of variations 25 through 28, wherein the step of cutting the one or more regions includes a step of cutting through holes in one of the one or more regions, cutting slots in a second region in one of the one or more regions, and leaving a third region in one of the one or more regions unchanged.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps. By use of the term "may" herein, it is intended that any described attributes that "may" be included are optional.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

2 Conveyor system
4 Zone
8 rollers
10 Master Roller
12 Slave Roller
14 Frame
16 transfer device
18 Roller brake
20 Roller shaft
22 Magnet
24 conductor
26 Roller Tube
28 Air gap
30 Bearing
32 Support
34 Magnetic material
36 Bearing Housing
38 Shaft Cover
40 Recesses
42 Through holes
44 Vertical Slots
46 Diagonal slots
48 Bars
50 Conductor wires
52 solid
54 Movement member
56 Movement Slot
60 Motor
70 Driven section
80 Gravity section

I claim:

1. A roller brake comprising:
   a. a roller shaft that supports one or more ends of the roller brake;
   b. a roller tube extending over all or a portion of the roller shaft;
   c. a magnet;
   d. a conductor located opposite the magnet, wherein the conductor is in communication with one of the roller shaft and the roller tube, and wherein the magnet is in communication with the other of the roller shaft and the roller tube; and
   e. an air gap separating the magnet and the conductor; and wherein the conductor includes one or more recesses that are an absence of material in the conductor.

2. The roller brake of claim 1, wherein the one or more recesses are a plurality of recesses.

3. The roller brake of claim 1, wherein the plurality of recesses have a circular shape, a square shape, a rectangular shape, are linear, are parallel to one another, are symmetrical, asymmetrical, geometric, or a combination thereof.

4. The roller brake of claim 1, wherein the plurality of recesses are vertical slots, diagonal slots, or both.

5. The roller brake of claim 1, wherein the conductor has a wall that includes the recesses.

6. The roller brake of claim 1, wherein the conductor is made of or include aluminum, copper, silver, bronze, brass, silver coated nickel or a combination thereof.

7. The roller brake of claim 1, wherein the conductor has substantially a same length as the roller shaft, the roller tube, or both.

8. The roller brake of claim 1, wherein the conductor is located in a first end region, a second end region, or both end regions.

9. The roller brake of claim 1, wherein the magnet has substantially a same length as a roller shaft, a roller tube, the conductor, or a combination thereof.

10. The roller brake of any of claim 1, wherein the magnet is located in a first end region, a second end region, or both end regions.

11. The roller brake of any of claim 1, wherein the conductor has a thickness of between about 0.00001 mm and 10 mm.

12. The roller brake of claim 1 wherein the conductor has a thickness of about 0.00001 mm or more, about 0.0001 mm or more, about 0.001 mm or more, about 0.01 mm or more, about 0.1 mm or more, or about 1 mm or more.

13. The roller brake of claim 1, wherein the conductor has a thickness of about 10 mm or less, about 7 mm or less, about 5 mm or less, about 3 mm or less, about 2 mm or less, or about 1.25 mm or less.

14. A conveyor system comprising one or more roller brakes as set forth in claim 1.

15. The conveyor system of claim 14, wherein the conveyor system includes a region that extends at an angle so that items or packages in communication with the region move along the region by gravity and the roller brake controls speed of the items or packages.

16. The conveyor system of claim 14, wherein the conductor is connected to a magnetic material.

17. The conveyor system of claim 16, wherein the magnetic material is a ferromagnetic material.

18. The conveyor system of claim 14, wherein the magnet is part of a rotor and the conductor is part of a stator.

19. The conveyor system of claim 14, wherein the conductor is part of a rotor and the magnet is part of a stator.

20. The conveyor system of claim 14, wherein the conductor is a plurality of wires.

21. The conveyor system of claim 20, wherein the plurality of wires are discrete from one another and electrically separate.

22. The conveyor system of claim 20, wherein the plurality of wires are electrically connected to one or more other wires of the plurality of wires.

23. The conveyor system of claim 20, wherein one of the plurality of wires are electrically connected to one or more resistors.

24. The conveyor system of claim 20, wherein the plurality of wires are in a star pattern.

25. A method comprising:
   a. placing a planar conductor on a cutting surface;
   b. cutting one or more regions of the planar conductor to form one or more recesses that are an absence of material in the conductor;
   c. shaping the planar conductor so that a first end and a second end of the planar conductor are proximate to one another;
   d. connecting the first end and the second end together to form a conductor; and
   e. inserting the conductor into an assembly of a motor brake.

26. The method of claim 25, wherein the conductor is in contact with and connected to a roller tube.

27. The method of claim 25, wherein the conductor is in contact with and connected to a roller shaft.

28. The method of claim 25, wherein a support is located between a roller shaft and the conductor.

29. The method of claim 25, wherein the step of cutting the one or more regions to form one or more recesses that are an absence of material in the conductor includes a step of cutting through holes in one of the one or more regions, cutting slots in a second region in one of the one or more regions, and leaving a third region in one of the one or more regions unchanged.

* * * * *